United States Patent
Cahn et al.

(10) Patent No.: US 7,912,158 B2
(45) Date of Patent: Mar. 22, 2011

(54) SAMPLING THRESHOLD AND GAIN FOR SATELLITE NAVIGATION RECEIVER

(75) Inventors: Charles R. Cahn, Manhattan Beach, CA (US); Jerry Eugene Knight, Long Beach, CA (US)

(73) Assignee: Navcom Technology, Inc., Torrance, CA (US)

( * ) Notice: Subject to any disclaimer, the term of this patent is extended or adjusted under 35 U.S.C. 154(b) by 847 days.

(21) Appl. No.: 11/270,253

(22) Filed: Nov. 8, 2005

(65) Prior Publication Data

US 2007/0104299 A1     May 10, 2007

(51) Int. Cl.
*H04L 27/08* (2006.01)

(52) U.S. Cl. ..... 375/345; 375/147; 375/245; 455/234.1; 455/136; 455/138

(58) Field of Classification Search .................. 375/345
See application file for complete search history.

(56) References Cited

U.S. PATENT DOCUMENTS

| | | | | |
|---|---|---|---|---|
| 4,901,307 A | * | 2/1990 | Gilhousen et al. | 370/320 |
| 5,101,416 A | * | 3/1992 | Fenton et al. | 375/150 |
| 5,281,968 A | * | 1/1994 | Iwanaga | 341/118 |
| 5,493,454 A | * | 2/1996 | Ziperovich et al. | 360/45 |
| 6,038,091 A | * | 3/2000 | Reed et al. | 360/46 |
| 6,038,435 A | * | 3/2000 | Zhang | 455/234.1 |
| 6,816,539 B1 | * | 11/2004 | Rog | 375/147 |
| 7,010,278 B2 | * | 3/2006 | Kirschenmann et al. | 455/114.2 |

OTHER PUBLICATIONS

Amoroso, F., "Adaptive A/D Converter to Suppress CW Interference in DSPN Spread-Spectrum Communications," IEEE Transactions on Communications, vol. COM-32, No. 10, Oct. 1983, pp. 1117-1123.
Maenpa, J.E., et al., "New Interference Rejection Technology from Lecia," Institute of Navigation, Proceedings of the Satellite Navigation Section, Sep. 1997, pp. 1-10.
International Search Report for International Application No. PCT/US2006/043168, mailed Apr. 5, 2007.

* cited by examiner

*Primary Examiner* — Shuwang Liu
*Assistant Examiner* — Lihong Yu
(74) *Attorney, Agent, or Firm* — Morgan, Lewis & Bockius LLP

(57) ABSTRACT

A satellite navigation device including a flexible radio frequency (RF) receiver is described. The receiver receives a signal that includes at least a first spread-spectrum signal from a first satellite. The receiver has a first channel that includes an analog-to-digital (A/D) converter to sample and quantize the signal and an automatic gain control (AGC) to adjust an amplification of the signal. The A/D converter has a first non-zero quantization threshold magnitude and a second non-zero quantization threshold magnitude. The AGC may adjust a gain in accordance with the first non-zero quantization threshold magnitude. The gain may correspond to a first pre-determined probability of a non-zero sample and the second non-zero quantization threshold magnitude may correspond to a second pre-determined probability of a non-zero sample.

24 Claims, 16 Drawing Sheets

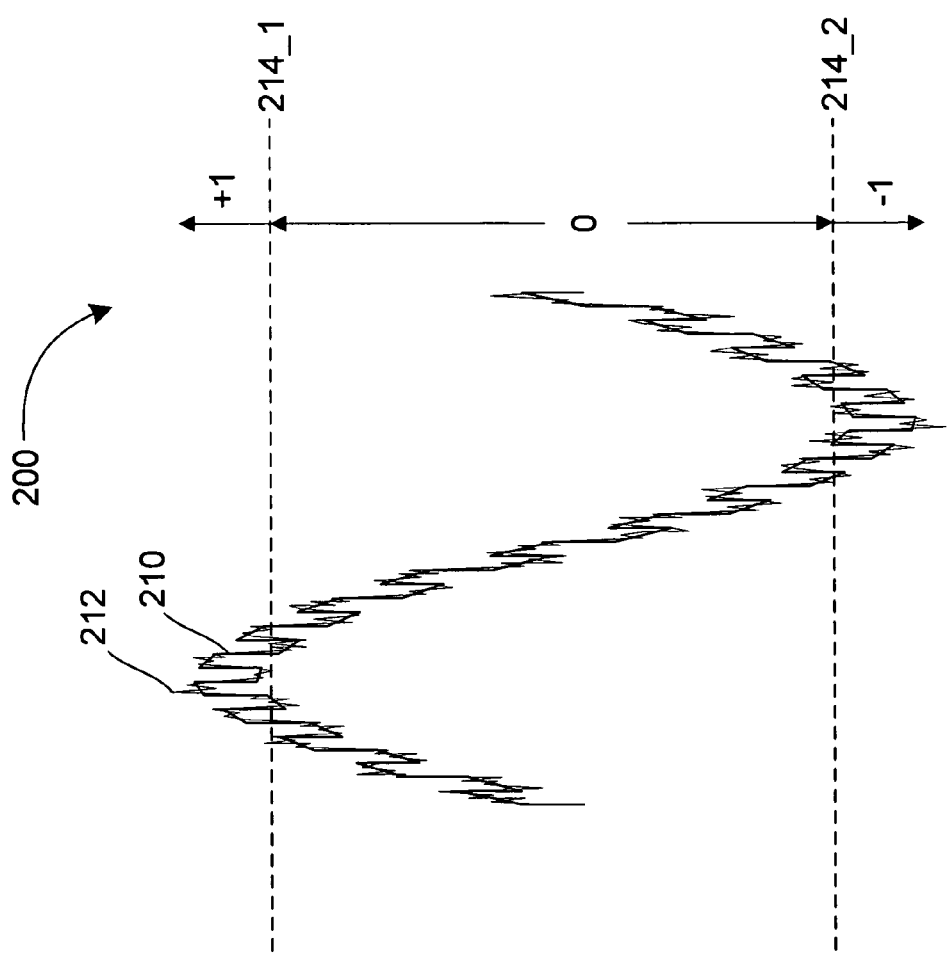

SAMPLING THRESHOLD AND GAIN FOR SATELLITE NAVIGATION RECEIVER

FIELD OF THE INVENTION

The present invention relates generally to quantized measurements that are subject to interference and more specifically, to a sampling threshold and quantization for improved satellite navigation receiver performance in the presence of interference signals in a global navigation satellite system (GNSS).

BACKGROUND OF THE INVENTION

Receivers in a global navigation satellite system (GNSS), such as the Global Positioning System (GPS), use range measurements that are based on line-of-sight navigation signals broadcast from satellites. A receiver measures a time-of-arrival of one or more broadcast signals. This time-of-arrival measurement includes a time measurement based upon a coarse acquisition (C/A) coded portion of a signal, called pseudo-range, and a phase measurement.

The presence of interference signals may degrade a signal-to-noise ratio (SNR) of one or more GNSS navigation signals. FIG. 2 illustrates continuous wave (CW) interference 200. The CW interference 200 can be viewed as an interfering signal, in this case sinusoidal, superimposed on a spread-spectrum signal 210 used by a respective GNSS signal. Before the spread-spectrum signal 210 is correlated in a receiver, an amplitude of the interfering signal is often significantly larger than an amplitude of the spread-spectrum signal 210. Correlation despreads an energy of the GNSS signal and spreads an energy of the interfering signal, which then becomes noise-like. If additional noise from the despread interfering signal is larger than an ambient background thermal noise 212, the SNR of the received GNSS signal is decreased.

The SNR of the GNSS signal varies with a local amplitude of the interfering signal. In addition, the background thermal noise 212 mask the spread-spectrum signal 210. When quantized, however, the spread-spectrum signal 210 is more easily detected at crests and troughs of the interfering signal, where a rate of change of the interfering signal is nearly zero. The spread-spectrum signal 210 is more difficult to discern at a maximum of a magnitude of the rate of change of the interfering signal.

One conventional anti-jamming approach used 3-level quantization 214 based on the amplitude of the interfering signal such that samples near the crests and troughs of the interfering signal are used during signal processing in the receiver. 10 to 20% of the samples that fall at the crests are weighted +1 and 10 to 20% that fall at the troughs are weighted -1. Remaining samples are discarded by giving them a weight of 0.

It may, however, be difficult to achieve desired sample populations in this conventional anti-jamming detection approach. There is a need, therefore, for an improved anti-jamming detection scheme in GNSS receivers.

SUMMARY

A satellite navigation device including a flexible radio frequency (RF) receiver is described. The receiver receives a signal that includes at least a first spread-spectrum signal from a first satellite. The receiver has a first channel that includes an analog-to-digital (A/D) converter to sample and quantize the signal and an automatic gain control (AGC) to adjust an amplification of the signal. The A/D converter has a first non-zero quantization threshold magnitude and a second non-zero quantization threshold magnitude. The AGC adjusts a gain in accordance with the first non-zero quantization threshold magnitude to produce a first predetermined probability of a non-zero sample $P_1$. The second non-zero quantization threshold magnitude may correspond to a second pre-determined probability of a non-zero sample $P_2$. The signal is amplified using the gain and quantized using the second non-zero quantization threshold magnitude in order to reduce an effect of an interference signal on the receiver at an arbitrary ratio of interference signal power to receiver noise power.

The A/D converter may output a range of values corresponding to 2, 3, 4 or 5 bits of quantization. The first non-zero quantization threshold magnitude corresponds to a first range of output values and the second non-zero quantization threshold magnitude corresponds to a second range of output values. The A/D converter may also use a look-up table including a first mapping and a second mapping. Non-zero samples in the first mapping are determined based on the first non-zero quantization threshold and non-zero samples in the second mapping are determined based on the second non-zero quantization threshold magnitude.

The first channel may include a dc-offset correction circuit to substantially reduce a dc-offset in the signal. The receiver may also include a blanking circuit that sums a number of events where a respective sample of the signal exceeds a threshold magnitude during a time interval and at least temporarily disables the receiver if the number of events exceeds a value. The threshold magnitude may be eight times the first non-zero quantization threshold magnitude. The receiver may be re-enabled after the number of events is less than the value.

The first channel may include a down-conversion circuit that converts the signal from a first carrier frequency signal to a near baseband signal. The near baseband signal has a second carrier frequency signal substantially less than one-quarter of a sampling rate. The receiver may also include a phase rotation circuit to perform a complex phase rotation on quantized quadrature samples of the near baseband signal such that a residual bias is substantially distributed uniformly over phase angles of 0 to 360° and thereby averages to substantially zero over an integration period corresponding to the first spread-spectrum signal. The phase rotation circuit may use a look-up table to perform the complex phase rotation.

BRIEF DESCRIPTION OF THE DRAWINGS

Additional objects and features of the invention will be more readily apparent from the following detailed description and appended claims when taken in conjunction with the drawings.

FIG. 2 illustrating continuous wave (CW) interference of a spread-spectrum signal.

Like reference numerals refer to corresponding parts throughout the several views of the drawings.

DESCRIPTION OF EMBODIMENTS

Figure 1:
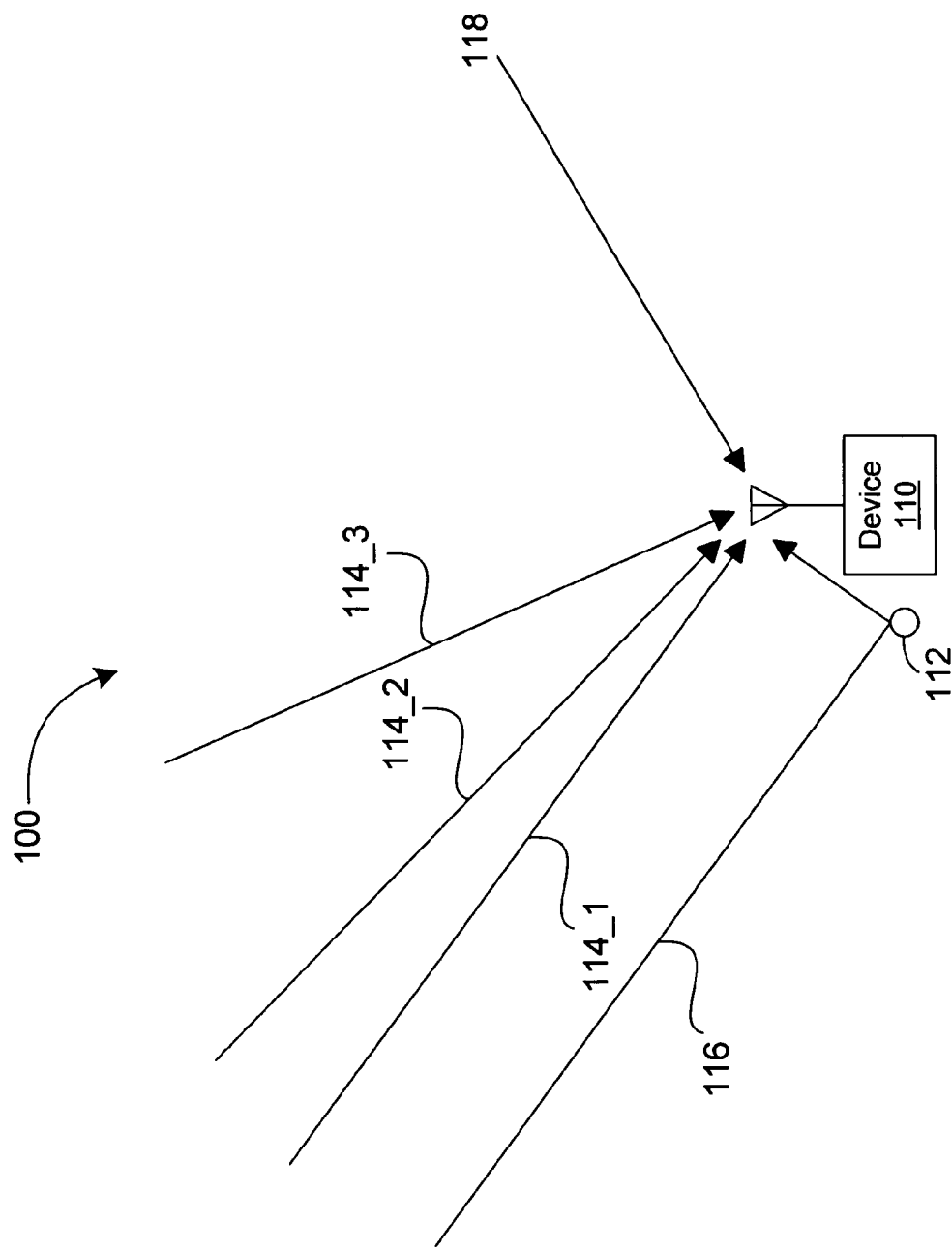
FIG. 1 is a diagram illustrating a global navigation satellite system (GNSS) with direct-path signals and a multi-path signal.

Reference will now be made in detail to embodiments, examples of which are illustrated in the accompanying drawings. In the following detailed description, numerous specific details are set forth in order to provide a thorough understanding of the present invention. However, it will be apparent to one of ordinary skill in the art that the present invention may be practiced without these specific details. In other instances, well-known methods, procedures, components, and circuits have not been described in detail so as not to unnecessarily obscure aspects of the embodiments.

A satellite navigation device including a flexible RF receiver for receiving one or more spread-spectrum signal from a first satellite with improved anti-jamming performance is described. Embodiments of the receiver receive a signal that includes at least a first spread-spectrum signal from a first satellite. The receiver has a first channel that includes an analog-to-digital (A/D) converter to sample and quantize the signal and an automatic gain control (AGC) to adjust an amplification of the signal. The A/D converter has a first non-zero quantization threshold magnitude corresponding to a first pre-determined probability of a non-zero sample $P_1$, also referred to as a first activity, and a second non-zero quantization threshold magnitude corresponding to a second pre-determined probability of a non-zero sample $P_2$, also referred to as a second activity. The AGC may adjust a gain in accordance with the first non-zero quantization threshold magnitude. The signal may be amplified using the gain and quantized using the second non-zero quantization threshold magnitude in order to reduce an effect of an interference or jamming signal on the receiver at an arbitrary ratio of interference signal power to receiver noise power. By controlling sample statistics rather than adjusting a signal amplitude and by taking advantage of some fortuitous statistical properties of Gaussian noise and jamming signals, the receiver enables desired sample populations, and thus improved anti-jamming performance, to be achieved.

In the embodiments of the satellite navigation device, navigation is understood to include determining a location or a position, also known as position fixing. Navigation is to be interpreted as determining where the satellite navigation device is with respect to a frame of reference that is at least in part provided by satellites in a GNSS. Navigation may also determine a time at the satellite navigation device based, at least in part, on signals from one or more satellites in a GNSS. GNSSs include, but are not limited to, a Global Positioning System (GPS), a Global Orbiting Navigation Satellite System (GLONASS), a GALILEO positioning system, a European Geostationary Navigation Overlay System (EGNOS), a Wide Area Augmentation System (WAAS), a Multifunctional Transport Satellite-Based Augmentation System (MSAS), a Quasi-Zenith Satellite System (QZSS), as well as a StarFire Network from NavCom Technology, Inc.

With the exception of GLONASS, GNSS satellites use code diversity multiple access (CDMA) methods to mitigate inter-satellite interference. The non-GLONASS satellites broadcast signals on carrier signal frequencies in an L-band and use spread-spectrum pseudorandom codes. The GLONASS system uses frequency diversity multiple access (FDMA) to provide inter-satellite interference protection. Each GLONASS satellite uses the same spread-spectrum code. With the exception of antipodal satellites, located in the same orbit on opposite sides of the Earth, each satellite has its own frequency band. Antipodal satellites may share the same frequency band.

Using GPS as an example, satellites broadcast navigation signals at a 1575.42 MHz L1 carrier signal frequency and a 1227.6 MHz L2 carrier signal frequency. A third GPS signal is planned for a 1176.45 MHz L5 carrier signal frequency. The GALILEO system plans to provide signals at L1 and L5 (also called E5A) and additional signals at 1207.14 MHz (E5B) and 1278.75 MHz (E6). GALILEO will also provide additional signals with different spread-spectrum codes at the L1 carrier signal frequency. The QZSS system plans to provide GPS compatible signals on the L1, L2 and L5 carrier signal frequencies. QZSS also plans to provide signals on an as-yet-undefined L6 carrier signal frequency. Satellites in WAAS, EGNOS and MSAS provide GPS-like signals on the L1 carrier signal frequency, and plan to provide a second signal on the L5 carrier signal frequency.

The StarFire Network, which functions at least partially as a communications link, uses channels that are 840 Hz wide in a frequency band between 1525 and 1560 MHz. StarFire Network transmits data at 1200 coded bits per second.

GLONASS broadcasts signals in the 1598.0635 to 1605.375 MHz (L1) and 1242.9375 to 1248.625 MHz (L2) band of frequencies. The bands of frequencies of signals in GLONASS overlap a high-end portion of corresponding bands of frequencies of signals in GPS and GALILEO.

FIG. 1 illustrates a composite signal received by a device 110 in an embodiment of a GNSS 100. The composite signal includes one or more signals 114 broadcast by one or more satellites as well as a multi-path signal 116 that is reflected off an object 112. As discussed above, the signals 114 each contain at least one spread-spectrum signal corresponding to at least one satellite.

Figure 3A:
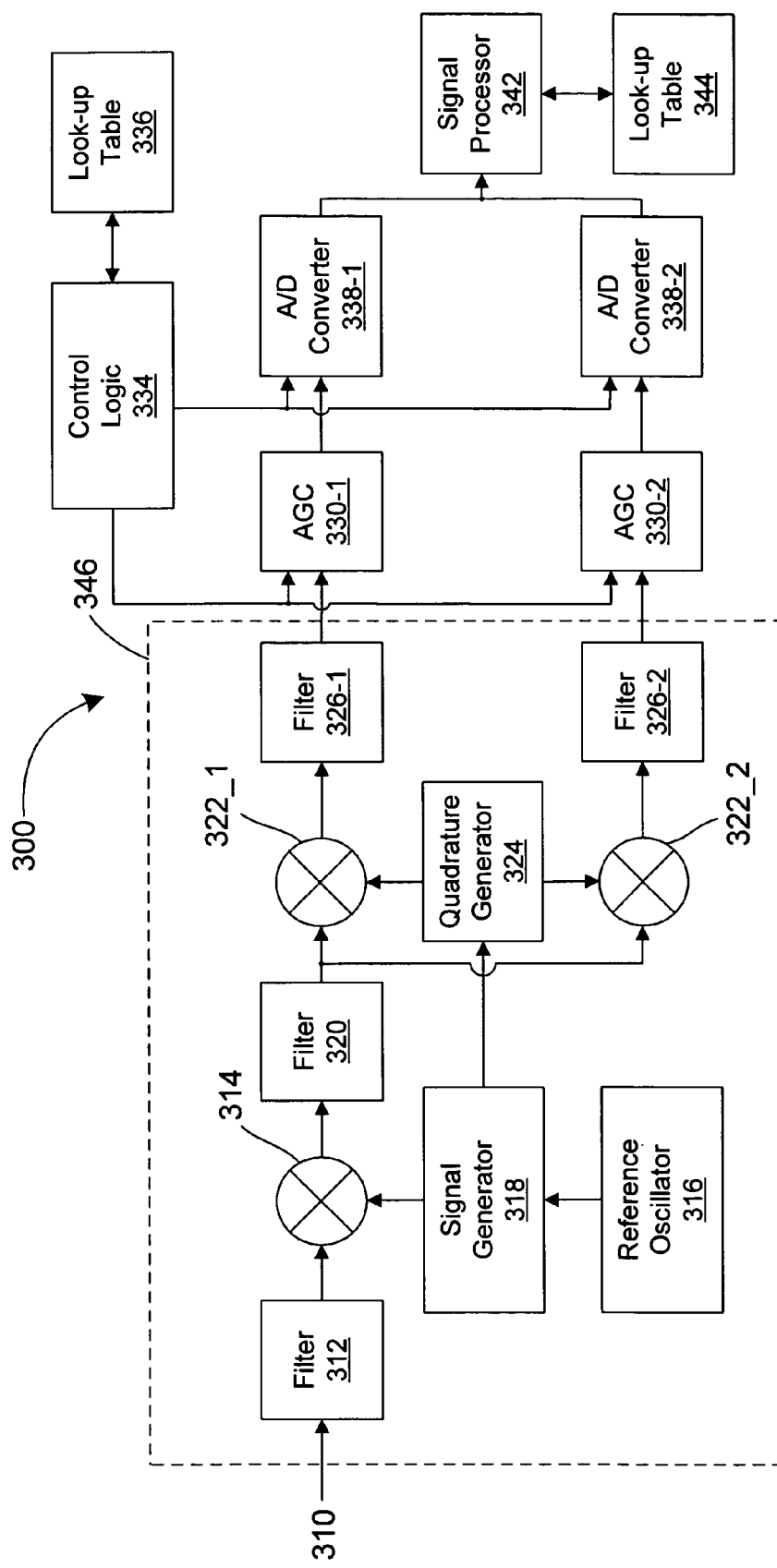
FIG. 3A is a block diagram illustrating components in a channel in a GNSS receiver.

FIG. 3A illustrates components in an embodiment of a sub-channel circuit 300 in the first channel in a receiver in the device 110 (FIG. 1). The composite signal is received by a front-end circuit including one or more antenna. Antenna inputs may be amplified or unamplified (passive) and may combine one or multiple frequencies per antenna connector in a router in the front-end circuit. In embodiments with an unamplified antenna or a long connector or cable between the antenna and the router, the front-end circuit may include an initial gain stage. At least a portion of the composite signal 310 is routed to one or more channels. The channels each include one or more sub-channel circuits, such as the sub-channel circuit 300. The sub-channel circuit 300 receives a respective frequency band in at least the one spread-spectrum signal, corresponding to at least the first satellite, in at least a portion of the composite signal 310.

The composite signal 310 is coupled to a low loss filter 312 to reject signal images and out-of-band interference. The signal may also be amplified in an amplifier (not shown) and/or filtered in filter (not shown) before coupling to the filter 312. In embodiments with the initial low-noise amplifier in the front-end electronics, this amplifying may be eliminated. At least a portion of the signal is down converted to an intermediate frequency (IF) using one or more modulators, such as mixer 314. In some embodiments, the IF is common in one or more additional sub-channel circuits. Down conversion in the mixer 314 mixes a first reference signal, having a respective first carrier or local oscillator (LO) frequency, that is generated by a signal generator 318.

The first reference signal may be generated based on one of more clock signals, which may be generated by the reference oscillator 316. Each sub-channel circuit in the receiver has a unique first LO frequency thereby allowing a respective sub-channel circuit, such as sub-channel circuit 300, to receive a respective frequency band in at least the one spread-spectrum signal from the first satellite. The sub-channel circuits may receive one or more of the clock signals from at least one common reference oscillator in the receiver. In other embodiments, there may not be the common reference oscillator. The reference oscillator 316 may include one or more phase locked loops, delay locked loops and/or interpolation circuits.

After down conversion, the signal at the IF is passed through a high-quality filter 320, such as a surface acoustic wave filter, that prevents signal aliasing and interference signals and rejects out of band interference. The high-quality filter 320 may allow other filters in the channel 300, such as the front-end pre-selection filtering, to be of lower precision, may allow easier implementation of automatic gain control (AGC) 330 and may also allow fewer bits quantization in A/D converters 338. Filters in the sub-channel circuits, such as the filter 320, define a signal processing bandwidth for the signal in the receiver. As a consequence, these filters, such as the filter 320, help define overall signal processing characteristics of the receiver. In some embodiments, the filters, such as the filter 320, may have a central frequency substantially equal to the IF and a bandwidth greater than approximately a bandwidth of the first satellite. In some embodiments, the bandwidth (3 dB passband) of one or more of the filters, such as the filter 320, may be greater than approximately 30 MHz (double sided). In some embodiments, the bandwidth (3 dB passband) of one or more of the filters, such as the filter 320, may be within an inclusive range of approximately 30 to 32 MHz (double sided). In an exemplary embodiment, the filter 320 may be equivalent to 6 or more complex poles. For a sub-channel corresponding to signals from the StarFire Network, the filter 320 also may have a central frequency substantially equal to the IF. In this case, however, the bandwidth of the filter 320 may be 200 kHz, since the signal in the StarFire network uses a smaller bandwidth.

By ensuring that the bandwidth of the filters, such as the filter 320, is at least slightly greater than filtering applied to the broadcast signals by one or more of the GNSS satellites, signal content will not be lost and as much out-of-band interference as possible is rejected. If the bandwidth of filters in one or more of the satellites is increased in the future, the bandwidth of one or more of the filters, such as the filter 320, also may be increased, so that signal content will not be lost. This may enable improved multi-path signal 116 (FIG. 1) correction and/or improved tracking characteristics of the receiver.

The signal in one or more sub-channel circuit, such as sub-channel circuit 300, is converted to substantially near baseband (zero frequency) using one or more modulators, such as mixers 322. Down conversion in the mixers 322 mixes second reference signals, each having a second carrier or LO frequency and that are substantially in quadrature with one another, that are provided by quadrature signal generator 324. The second reference signal may be generated based on at least one clock signal from the reference oscillator 316 and/or the common reference oscillator. Substantially near baseband may include frequencies substantially less than one-quarter of a sampling rate in the A/D converters 338. In some embodiments, substantially near baseband may include frequencies less than approximately 100 kHz.

Down converting to substantially near baseband effectively introduces an intentional Doppler frequency shift. One way to implement this is to set the carrier signal frequency of at least the one clock signal such that it is about 40 parts per million (PPM) too fast. This offset ensures that the I and Q samples from the A/D converters 338 all have a positive apparent Doppler frequency shift, which simplifies the design of signal generators, such as numerically controlled oscillators (NCOs), in signal processing circuits, such as signal processor 342. The offset also ensures that digital sampling edges are randomly distributed with respect to a timing of code bit edges in at least the one spread-spectrum signal from at least the first satellite.

In an exemplary embodiments, the reference oscillator 316 has a nominal carrier signal frequency of 16.36864 MHz. This is 39.101 MHz or approximately 40 PPM larger than 1.6 times the GPS 10.23 MHz fundamental frequency. The carrier signal frequency of at least the one clock signal from the reference oscillator 316 may vary over its lifetime by another 10 PPM due to aging and/or temperature variations. In other exemplary embodiments, the reference oscillator 316 may include a temperature compensated crystal oscillator (TCXO) and/or a voltage compensated crystal oscillator (VCXO).

The frequencies of the IF, first LO and second LO may preserve coherent relationships between code and carrier signal frequencies used by GNSS signals. For all GNSS signals, there are a substantially integer number of carrier cycles per code bit. Selected down-conversion frequencies, i.e., the respective first LO frequency and the second LO frequency, may preserve these relationships. Note that the relationships, however, are not sensitive to Doppler frequency shifts caused by satellite-receiver motion, reference signal, clock signal errors in the satellite or receiver and/or the intenional Doppler frequency shift discussed above. As discussed below, the receiver takes advantage of this property.

The IF and the second LO frequency may be substantially identical multiples of a frequency of at least a respective clock signal from the common reference oscillator in the receiver and/or the reference oscillator 316. Neglecting sources of Doppler (mentioned above), the sum of the two down-conversion frequencies, i.e., the respective first LO frequency and the second LO frequency, in each of the sub-channel circuits may be substantially equal to a respective carrier signal frequency, corresponding to the respective frequency band, in at least the one spread-spectrum signal from the first satellite. For example, the GPS L1 frequency band has a nominal carrier signal frequency of 1575.42 MHz, which is equal to 154·10.23 MHz. In embodiments where the receiver 200 (FIG. 2) uses a clock signal form the reference oscillator 316 having a frequency of $N_1 \cdot 10.23$ MHz, a first and a second LO are generated from this clock signal. The respective frequencies of these LO may obey several relationships that insure that the range measured by tracking the carrier frequency is substantially the same as the range measured by tracking the code. The carrier frequencies for each of the L-band signals can also be expressed in the form $N_0 \cdot 154$. ($N_0$=154 for L1, 120 for L2, 115 for L5, 118 for E5A and 125 for E6.). The frequency of the first LO is created by multiplying the reference clock signal by A, i.e., $LO_1 = A \cdot N_1 \cdot 10.23$ MHz. The frequency of the second LO is substantially equal to the IF and is created by multiplying the reference clock signal by B, i.e., $LO_2 = B \cdot N_1 \cdot 10.23$ MHz. Multipliers A and B are chosen such that they obey the relationship $s \cdot (N_0 - A \cdot N_1) = B \cdot N_2$, where s=1 for a low-side down conversion and s=−1 for a high-side down conversion. For example, if the high-side first down conversion is used to convert the L1 signal to an IF equal to $13.7 \cdot 10.23$ MHz (=140.151 MHz), s is equal to −1 and $B \cdot N_1$ is equal to 154+13.7 or 167.7. If the low-side down conversion is used instead, s is equal to 1 and $B \cdot N_1$ is equal to 154−13.7 or 140.3. A different multiplier A may be used for each of the GNSS frequencies. The same IF and multiplier B may be used for all frequencies. Note that, in a sense, high-side conversion produces an IF with a negative frequency, but the filters in the receiver and subsequent down conversions behave the same for positive and negative frequencies.

One or more sub-channel circuits for signals from the StarFire Network may not use quadrature detection. The second LO frequency may be adjusted in small, approximately 21 Hz, steps so that the second LO frequency matches a central frequency of the StarFire communication channel. A controller in the receiver, the first channel and/or one of the sub-channel circuits, such as the sub-channel circuit 300, may sequentially program signal generator 324 to appropriate frequencies corresponding to each possible StarFire band of frequencies to determine if the respective signal is present. Note that it may not be necessary to maintain special relationships between the code and the carrier signal frequencies in the StarFire signal processing, so there may be more freedom in the selection of the respective first LO frequency and the second LO frequency.

After down conversion to near baseband, in-phase and out-of-phase signals are coupled to low-pass filters 326 to remove unwanted spectral components. The signals are amplified based on gains determined using the AGC 330 and sampled and quantized in the A/D converters 338 to produce in-phase I and out-of-phase Q samples. The I and Q samples are processed in the signal processor 342. The signal processor 342 may use values stored in look-up table 344. AGC 330 and the A/D converters 338 may be configured and/or adjusted by control logic 334 using values stored in look-up table 336. Configuring and/or selecting of the gains and A/D quantization threshold magnitudes is discussed further below.

In some embodiments, the IF, the first LO frequency and/or the second LO frequency in one or more of the sub-channel circuits, such as the sub-channel circuit 300, may be adjustable and/or configurable. This is implemented by adjusting and/or reconfiguring at least one signal generator, such as signal generator 318 using the controller in the receiver, the first sub-channel and/or one of the sub-channel circuits, such as the sub-channel circuit 300. For example, the second LO frequency in the reference signal from the quadrature signal generator 324 may be adjusted in steps of a few hundred Hz. When adapting or configuring the IF, at least one of the filter 320, the filters 326, the mixers 322 and/or the mixer 314 may be adjusted or reconfigured. Note that the previously discussed relationship between code and carrier may be preserved for navigation signals when the IF is modified. This relationship may or may not be preserved for some communication signals, such as StarFire.

By allowing the IF, the first LO frequency and/or the second LO frequency to be configurable, the IF can be configured to a value within an inclusive range of approximately 100 to 350 MHz. Embodiments where the IF, the first LO frequency and/or the second LO frequency are adjustable may allow one or more of the sub-channel circuits to be dynamically configured to an IF with the inclusive range. A configurable or adaptable IF offers additional design degrees of freedom. These degrees of freedom may allow the IF in one or more sub-channels to be changed to meet requirements of components, such as filters 312, 320 and/or 326, signal generator 318, quadrature signal generator 324, and/or mixers 314 and 322. For example, if during a production lifetime of the receiver, one or more components become obsolete or one or more better components corresponding to a different IF range become available, the IF may be changed by configuring or adapting the first LO frequency and/or the second LO frequency in one or more sub-channel circuit. In exemplary embodiments, the IF may be 140, 160 and/or 200 MHz, since these values may match the specifications of low-cost filters and mixers that have been developed for cellular telephones.

In other embodiments, the sub-channel 300 may have fewer or more components. Functions of two or more components may be implemented in a single component. Alternatively, functions of some components may be implemented in additional instances of the components or in components elsewhere in the receiver. While FIG. 3A illustrates one sub-channel circuit 300, in some embodiments there may be more sub-channel circuits. In some embodiments, one or more of the sub-channel circuits may not use quadrature detection and sampling. Instead, the signal may be converted to near baseband in one or more mixers using the second reference signal, having the second carrier or LO frequency.

Figure 3B:
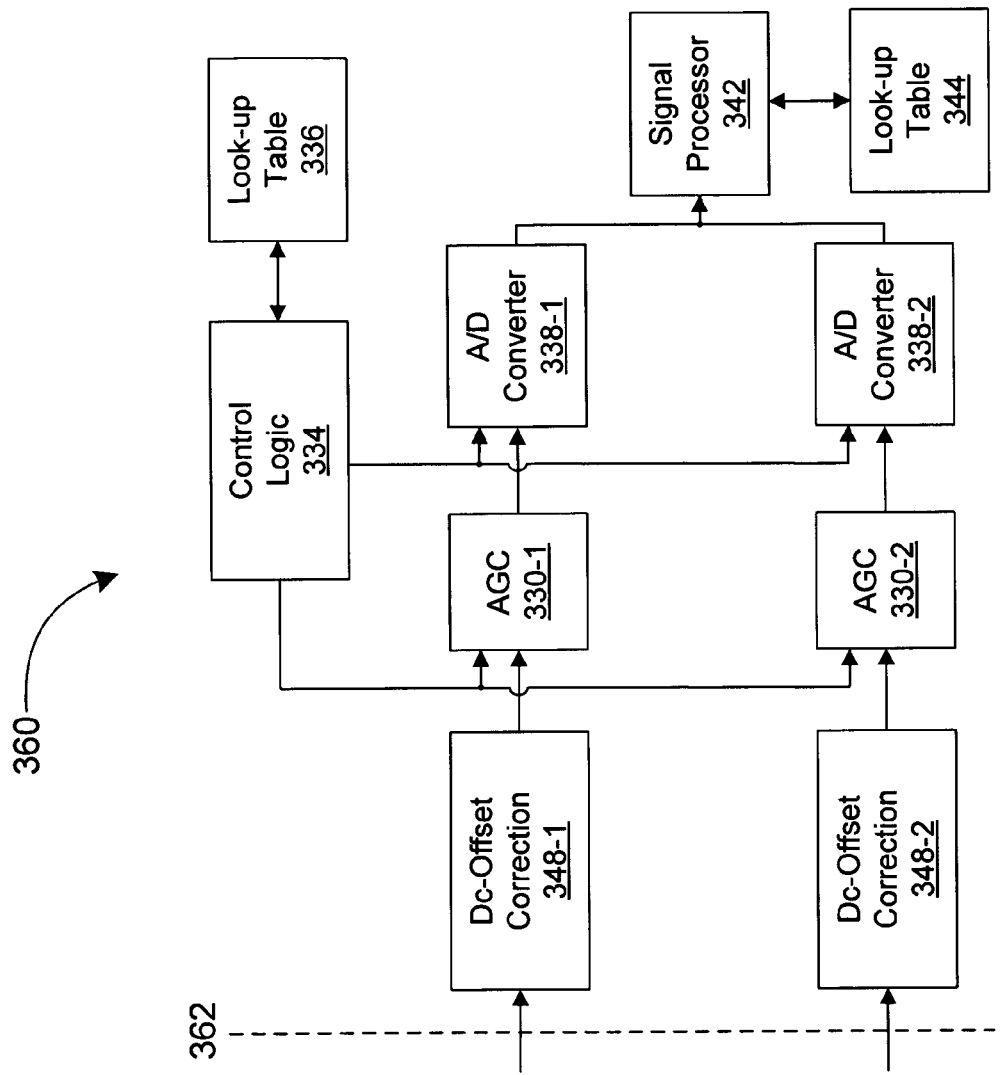
FIG. 3B is a block diagram illustrating components in a channel in a GNSS receiver.

FIG. 3B illustrates an embodiment of a sub-channel circuit 360. Vertical line 362 corresponds to a detection circuit 346 in FIG. 3A. For proper performance of the sub-channel circuit 360, equal numbers of positive and negative A/D samples from A/D converters 338 are desired. If the A/D samples do not average to zero, they contain a bias, also called a DC bias, that during a code correlation process (432 and 434 in FIG. 4) will be converted to additional interfering noise, or, if the DC-bias is larger than an auto-correlation protection provided by a respective spread-spectrum code, will appear as an interfering satellite signal. DC-offset correction circuits 348 adjust the in-phase and out-of-phase signals near baseband to reduce a DC bias in one or both of these signals.

One approach for removing DC-bias is to average the A/D samples for a period and subtract the resulting average from the incoming A/D samples. This approach, however, may use many bits of precision in the de-biased A/D samples, and consequently many bits of precision during signal processing 342. Other methods include hand or software calibration of the DC-biases. These methods measure the DC-bias and adjust A/D reference voltages or thresholds by manually adjusting components in the sub-channel circuit 360 or providing a variable feedback voltage using a digital to analog (D/A) converter.

Figure 14:
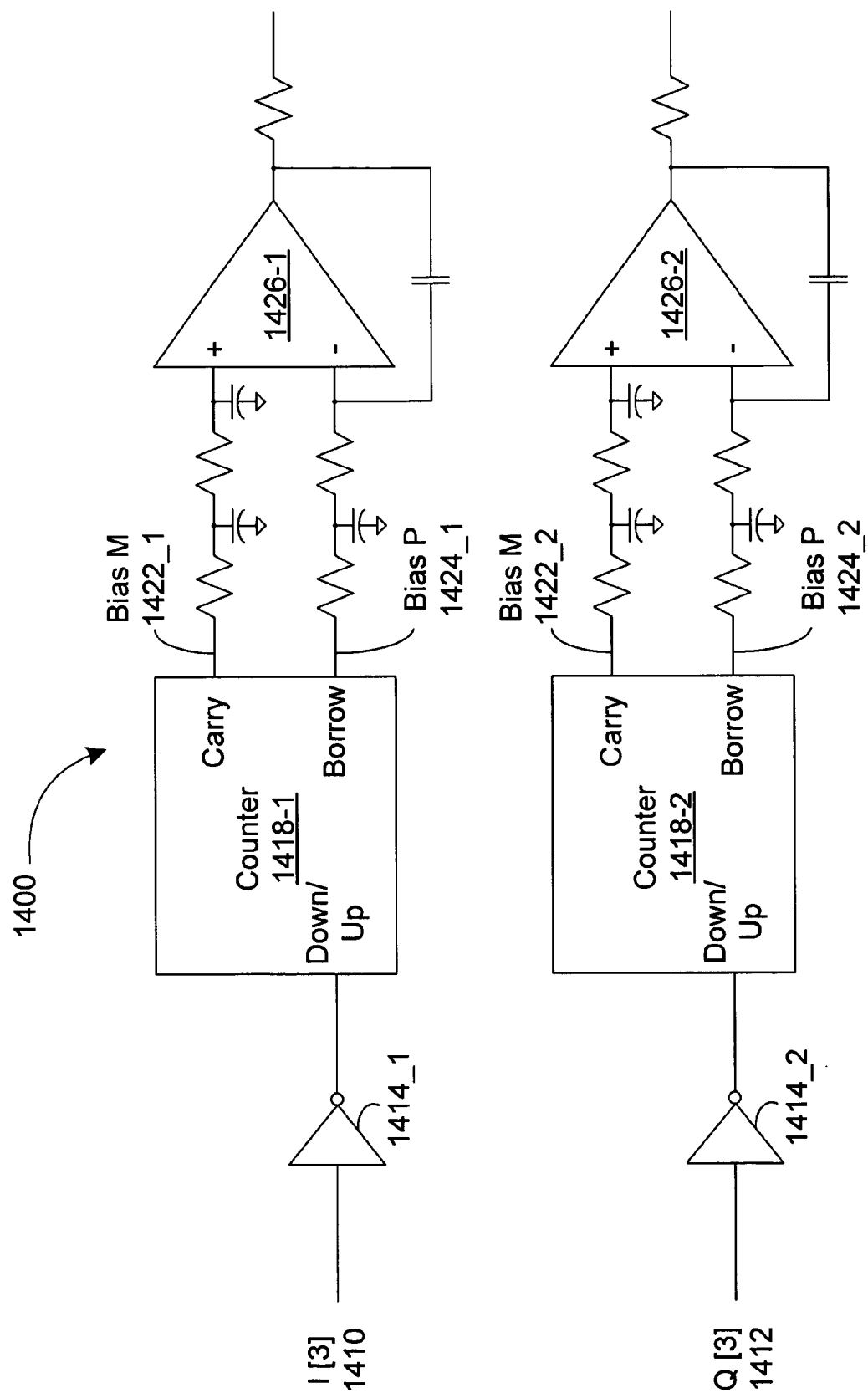
FIG. 14 is a block diagram illustrating a DC offset correction circuit in a GNSS receiver.

FIG. 14 illustrates an embodiment of a circuit 1400 used to remove DC-biases. The circuit 1400 optionally inverts I samples 1410 and Q samples 1412 using optional inverters 1414. Up/down counters 1418 increment their respective counts by one if a sample is positive and decrement their respective counts by one if the sample is negative. If one of the counters 1418 overflows, there is a surplus of positive samples, so a pulse is applied on one Bias M 1422 to a non-inverting input of one opamp 1426 and one reference voltage is increased. If one of the counters 1418 underflows, there is a surplus of negative samples, so a pulse is applied on one Bias P 1424 to an inverting input of the opamp 1426 and one reference voltage is decreased. The opamps 1426 and their associated feedback circuitry are selected so that an integration time of pulses is between 100 ms and 10 s. Over time, the opamps 1426 integrate the feedback pulses and adjusts the reference voltages so that there are equal numbers of positive and negative samples and a mean of the I samples 1410 and the Q samples 1412 is zero.

Referring to FIG. 3A, the A/D converters 338 have several embodiments for converting one or more GNSS signals from analog to digital form. As is known in the art, a respective sampling rate equal to or greater than a Nyquist rate of the signals is acceptable. In embodiments where complex samples are used, the sampling rate may be greater than or equal the bandwidth of the filters 326. For example, for GPS signals the sampling rate may be greater than 32 MHz. In other exemplary embodiments, the sampling rate may be 40, 60 or 80 MHz. Since power consumption and timing constraints during signal processing increase in proportion to the sampling rate, a 40 MHz sampling rate may be suitable for existing and planned GNSS signals. If future, higher-bandwidth GNSS signals become available, the bandwidth of the filters 326 and the sampling rate of the A/D converters 338 may be increased accordingly based on the new Nyquist rate.

In some embodiments, one or more sub-channel circuits, such as sub-channel circuit 300, in the first channel may be configurable to output one or more digital signals having an adjustable or configurable number of bits. The number of bits may be 1, 2, 3, 4, 5, or more, including 1-bit (2-level) quantization, 2-bit (3-level or a sign and a magnitude, i.e., 1, 0 and −1) quantization, 2-bit (4-level) quantization and 3-bit (8-level) quantization. In some embodiments, a larger number of bits may be used. However, a complexity of an A/D converter, such as the A/D converters 338 varies as a square of the number of bits and there may be diminishing returns as the number of bits is increased beyond 5. The number of bits may be dynamically configured or adapted. The configuring and/or adapting may be controlled by the controller in the receiver and/or a controller in at least one of the sub-channel circuits, such as sub-channel circuit 300. In embodiments where one or more sub-channel circuits are configured to output digital signals having 1 bit, one or more of the A/D converters 338 may be replaced with a comparator. Since the information content of the StarFire Network signal (1200 or 2400 bits per second) is much smaller than for the GNSS signals, a lower sampling rate may be used, such as 38.4 kHz. This rate is 16 or 32 times the Nyquist rate and facilitates possible future increases in a broadcast data rate. It also allows synchronization of data bit edges with asynchronous digital samples without a significant loss of signal power.

The presence of interference signals, as illustrated in FIG. 2, may degrade a signal-to-noise ratio (SNR) of one or more GNSS navigation signals. As noted previously, one conventional anti-jamming detection approach attempts to reduce the impact of the CW interference by placing quantization threshold magnitudes 214 (FIG. 2) based on the amplitude of the interfering signal such that samples near the crests and troughs of the interfering signal are used during signal processing 342 (FIG. 3A) in the receiver. It may be difficult to achieve desired sample populations in this conventional anti-jamming detection approach. Embodiments of the receiver achieve the desired sample populations by controlling sample statistics, based on statistical properties of Gaussian noise and interfering signals, rather than the amplitude of the interfering signal.

Figure 5:
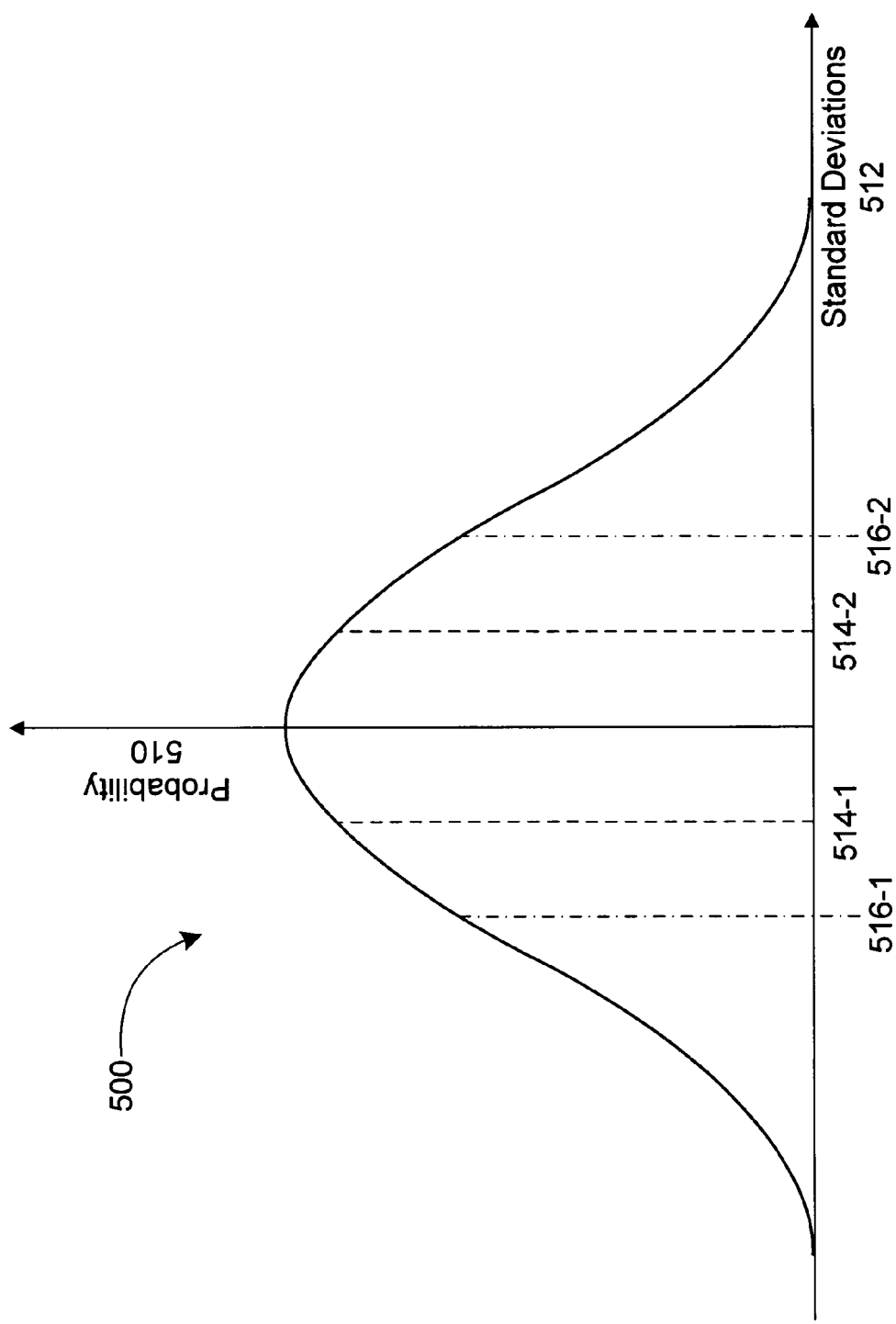
FIG. 5 illustrates a sample population distribution.

A/D samples in GNSS receivers are typically noise limited, i.e., an amplitude of the noise is much greater than an amplitude of the navigation signals broadcast by the satellites. The noise is known to have normal or Gaussian statistics, and is henceforth called Gaussian noise. FIG. 5 shows probability 510 as a function of normalized deviation 512 from a population mean for a sample population 500 having Gaussian statistics. In some embodiments, the deviation 512 is normalized such that the standard deviation is 1.0. A third of all samples have magnitudes within 0.43 standard deviations of the population mean (between lines 514-1 and 514-2. A third of all samples are greater than the mean plus 0.43 standard deviations (line 514-2) and a remaining third of all samples are less than the mean minus 0.43 standard deviations (line 514-1).

For Gaussian noise with phase θ, approximately 60% of all samples occur within 0.86 standard deviations (between lines 516-1 and 516-2). In this case, 20% of the samples are larger than the mean plus 0.86 standard deviations (line 516-2) and 20% are less than the mean minus 0.86 standard deviations (line 516-1).

When the interfering signal is larger than the Gaussian noise, the probability that |cos(θ)| is greater than 0.5 is 0.667, since cos(60°) equals 0.5. Therefore, if the interfering signal does not saturate the receiver, the AGC 330 (FIG. 3A) may adjust, using a first non-zero quantization threshold, the gain of the quantization circuit for at least one of the A/D converters 338 (FIG. 3A), such that the pre-determined probability of a non-zero sample $P_1$ or the first activity equals or approximately equals ⅔. In this way, the first non-zero quantization threshold magnitude may be set to one half of the amplitude of the interfering signal even though the amplitude of the interfering signal has not been determined. Quantizing the signals in at least one of the A/D converters 338 (FIG. 3A) in the sub-channel 300 (FIG. 3A) using the gain and a second non-zero quantization threshold magnitude substantially equal to twice the first non-zero quantization threshold magnitude corresponds to |cos(θ)| equal to 1.0, i.e., the crests and troughs of the interfering signal. This allows samples where the rate of change of the interfering signal is nearly zero to be used in signal processing 342 (FIG. 3A) thereby improving the performance of the receiver in the presence of strong interference, such as CW interference. As discussed further below, the use of this approach to setting the gain using the AGC 330 (FIG. 3A) and the A/D converter 338 (FIG. 3A) quantization threshold magnitude does not appreciably degrade the performance of the receiver in the absence of the interference. While the approach described in this paragraph, uses the gain and the first non-zero quantization threshold magnitude corresponding to the first activity of ⅔, and the second non-zero quantization threshold magnitude substantially equal to twice the first non-zero quantization threshold magnitude, in other embodiments a different activity and a different ratio of the second non-zero quantization threshold magnitude to the first non-zero quantization threshold magnitude may be used.

The anti-jamming detection approach may be implemented using a look-up table 336 (FIG. 3A). In some embodiments, the look-up table 336 (FIG. 3A) may be programmable. The A/D converters 338 (FIG. 3A) may perform a first mapping using the first non-zero quantization threshold magnitude and a second mapping using the second non-zero quantization threshold magnitude. Table I illustrates a look-up table 336 suitable for the first and second mappings. In the first mapping, 4-bit A/D samples are defined such that two thirds of the samples have a magnitude greater than or equal one (active) and one third of the samples are inactive. In the second mapping, a non-zero quantization threshold magnitude is doubled and the samples are converted to 3-level (sign and magnitude) quantization. These samples have statistics corresponding to the third of all samples greater than the mean plus 0.43 standard deviations (line 514-2) in FIG. 5 and the remaining third of all samples less than the mean minus 0.43 standard deviations (line 514-1) in FIG. 5 in the absence of the interference. When strong interference is present, the samples correspond to the crests and troughs of the interfering signal.

TABLE I

First and second mapping in a look-up table.

| First Mapping | | | Second |
|---|---|---|---|
| 4-Bit Quantization (Binary) | A/D Sample Value | Sample Type | Mapping 3-Level Quantization |
| 1111 | +7 | Active | +1 |
| 1110 | +6 | Active | +1 |
| 1101 | +5 | Active | +1 |
| 1100 | +4 | Active | +1 |
| 1011 | +3 | Active | +1 |
| 1010 | +2 | Active | +1 |
| 1001 | +1 | Active | 0 |
| 1000 | +0 | Inactive | 0 |
| 0111 | −0 | Inactive | 0 |
| 0110 | −1 | Active | 0 |
| 0101 | −2 | Active | −1 |
| 0100 | −3 | Active | −1 |
| 0011 | −4 | Active | −1 |
| 0010 | −5 | Active | −1 |
| 0001 | −6 | Active | −1 |
| 0000 | −7 | Active | −1 |

Other embodiments of the look-up table 336 (FIG. 3A) may have only one mapping and/or may use different bit quantizations for the first mapping and/or the second mapping. For example, a 5-level quantization may be implemented or selected using the control logic 334 (FIG. 3A). In the 5-level quantization, sample values q(v) based on a measured voltage v of the samples are q(v)=−2; v<−V
q(v)=−1; −V<v<−0.5V
q(v)=0; −0.5V<v<0.5V
q(v)=1; 0.5V<v<V
q(v)=2; V<v, where V represents a threshold magnitude for quantization. This may be restated equivalently in terms of 3 levels:

q(v)=−1 and Active v<−V
q(v)=0 and Active −V<v<−0.5V
q(v)=0 and Inactive −0.5V<v<0.5V
q(v)=0 and Active 0.5V<v<V
q(v)=1 and Active V<v.

In order to assess the performance of this anti-jamming detection approach, additional theoretical background is provided below. An ideal A/D converter using 3-level quantitization assigns q(v) as q(v)=−1 v<−V
   =0 −V<v<V
   =1 V<v.

It is assumed that the samples are balanced about zero, for example, using a DC offset correction circuit 348 (FIG. 3A), so there is substantially little or no DC offset.

The Amplitude s of the signal from a respective satellite is much less than the Gaussian noise plus the amplitude of the interfering signal due to a power spreading of the spread-spectrum code. A probability function for the signal p(x) has mean z of zero.

For 3-level samples with values spaced by 1.0 (i.e., samples of −1, 0 and 1), a mean of the desired signal is $$m = s[p(V) + p(-V)]$$

and the variance is $$\text{var} = \int_{-\infty}^{-V} p(x)\,dx + \int_{+V}^{+\infty} p(x)\,dx. \quad (1)$$

The SNR of output samples is defined as $$S/N]_q = \frac{m^2}{\text{var}}.$$

The SNR of a desired signal and Gaussian noise is $$S/N = \frac{s^2}{\sigma_n^2}.$$

where $\sigma_n^2 = N$ represents a variance of the Gaussian noise component of p(x).

A degradation D of the output signal in the presence of the CW interference is $$D = \frac{S/N]_q}{S/N} = \frac{m^2/\text{var}}{s^2/\sigma_n^2} = \frac{\sigma_n^2[p(V)+p(-V)]^2}{\int_{-\infty}^{-V} p(x)\,dx + \int_{+V}^{+\infty} p(x)\,dx} = \frac{2\sigma_n^2 p(V)^2}{\int_{+V}^{+\infty} p(x)\,dx}.$$

This equation assumes that p(x) is symmetrical about 0, which is valid for the spread-spectrum GNSS codes. A probability density function for the Gaussian noise is $$p(x) = \frac{1}{\sqrt{2\pi\sigma_n^2}} e^{-x^2/2\sigma_n^2}.$$

Therefore, the probability P that the 3-level quantized value of the sample s is non-zero is $$P = \int_{-\infty}^{-V} p(x)\,dx + \int_{+V}^{+\infty} p(x)\,dx \quad (2)$$

because the quantized value of the sample is zero for −V<x<V. Note that Equation 2 is identical to Equation 1, the equation for the variance. P is defined to be the activity of the samples.

When CW interference is present, at least the sinusoidal interfering signal is added to the Gaussian noise. The equation for the activity, i.e., Equation 2, for the signal including the interfering or jamming signal is a convolution of the probability density functions for the Gaussian noise and the sinusoidal interfering signal since the Gaussian noise and the sinusoidal interfering signal are independent. At the receiver, the phase θ of the sinusoidal interfering signal is random with respect to the signal, i.e., the probability density function is uniform over 0 to $2\pi$. An instantaneous value of the sinusoidal interfering signal at an arbitrary phase $\phi$ is $$j = \sqrt{2J} \cos \theta, \qquad (3)$$

where J represents an average power for the sinusoidal interfering signal. Note that even if the CW interference is non-sinusoidal, for example, a square wave signal, a complex rotation 426 (FIG. 4), discussed further below, which is performed in some embodiments of the receiver, has the effect of making such CW interference approximate a sinusoidal interfering signal.

Figure 6:
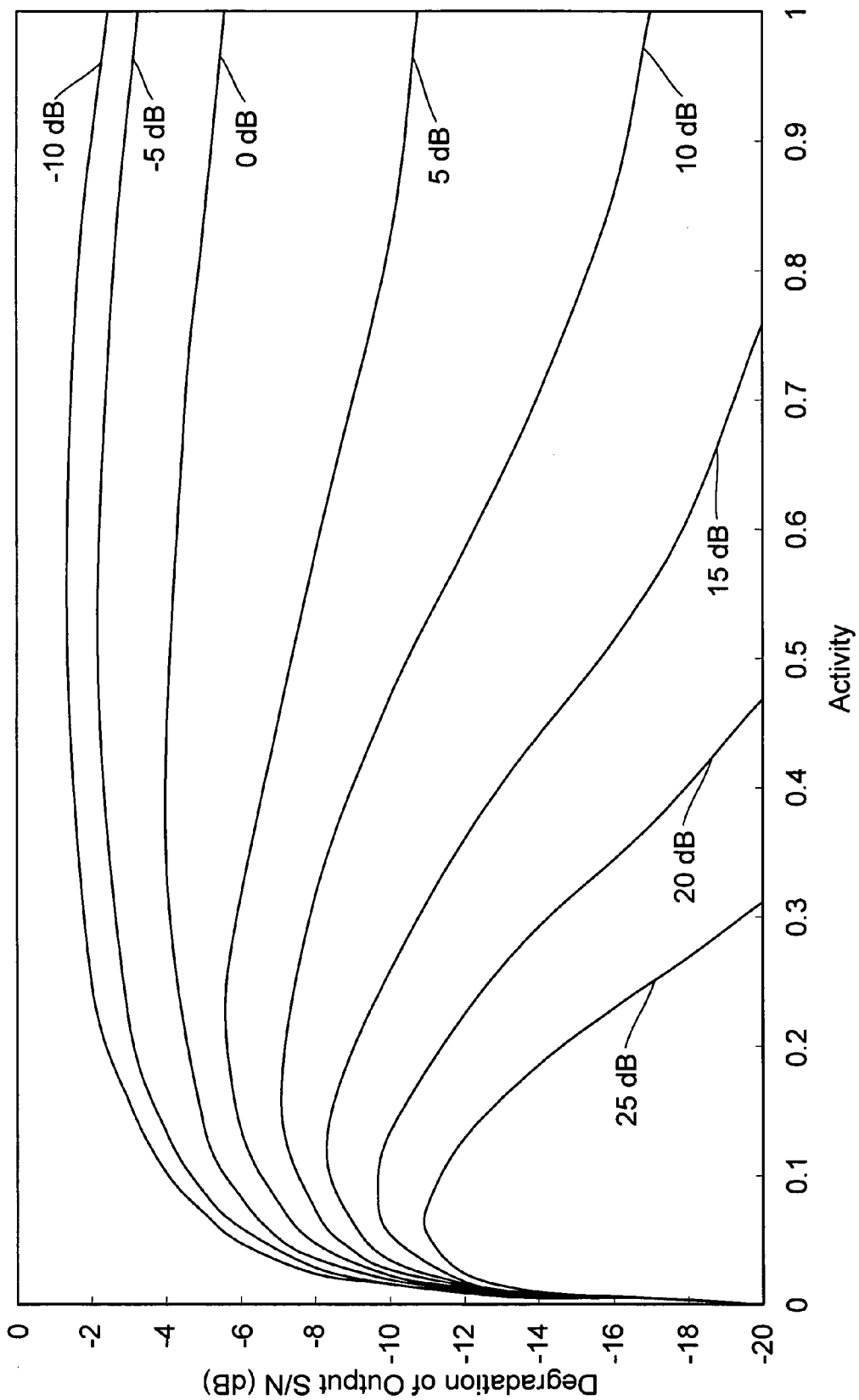
FIG. 6 is a plot of calculated degradation in an output signal-to-noise (SNR) ratio as a function of CW interfering signal power.

FIG. 6 is a plot of a calculated degradation D in the SNR of the output signal as a function of the probability of a non-zero sample P or the activity in a 3-level converter, such as that illustrated by the second mapping in Table I, for a variety of ratios of the average power of the sinusoidal interfering signal to a Gaussian noise power, i.e., various values of $$J/N = J/\sigma_n^2.$$

A problem is how to determine a jamming level, i.e., the ratio of J/N, and a corresponding optimum probability of a non-zero sample P or the activity. As the average power J of the sinusoidal interfering signal increases, an optimum activity should decrease. If the J/N ratio were known, the activity could be adjusted by a controller, such as control logic 334 (FIG. 3A) in accordance with the probability of a non-zero sample P in Equation 2. It is, however, difficult to estimate the ratio J/N because that requires an accurate calibration of the sub-channel circuit 300 (FIG. 3A) and a good estimation of a noisy parameter. The anti-jamming detection approach described above and implemented in embodiments of the receiver helps overcome this difficulty.

Selecting the second non-zero quantization threshold magnitude to correspond to the crests and troughs of the sinusoidal interfering signal implies that probability of a non-zero sample P or the activity approaches but does not quite equal 0. Determining the second non-zero quantization threshold magnitude by selecting the first probability of a non-zero sample $P_1$ or the first activity corresponding to a reduced first non-zero quantization threshold magnitude allows more room for error since the first probability of a non-zero sample $P_1$ or the activity is larger than 0. In an exemplary embodiment, the first probability of a non-zero sample $P_1$ or the activity is substantially ⅔. By adjusting the gain using the AGC 330 (FIG. 3A) in accordance with the first non-zero quantization threshold magnitude, for example, 0.5V, the second probability of a non-zero sample $P_2$ is approximately 0 for the second non-zero quantization threshold magnitude, which in this example is V, in the presence of strong interference relative to the Gaussian noise, i.e., negligible noise. For the case of Gaussian noise only, determining the gain using the AGC 330 (FIG. 3A) results in the same first activity of ⅔ for the first non-zero quantization threshold magnitude of 0.5V and results in the second probability of a non-zero sample $P_2$ equal to 0.39 when the second non-zero quantization threshold magnitude of V is used. As shown in FIG. 6, this is close to the optimum for this case. This anti-jamming detection approach (adjusting the gain using the AGC 330 in FIG. 3A in accordance with the reduced first non-zero quantization threshold magnitude of 0.5V in order to obtain an activity of substantially ⅔) has been found to improve the receiver performance for a wide range of the ratio J/N.

Figure 7:
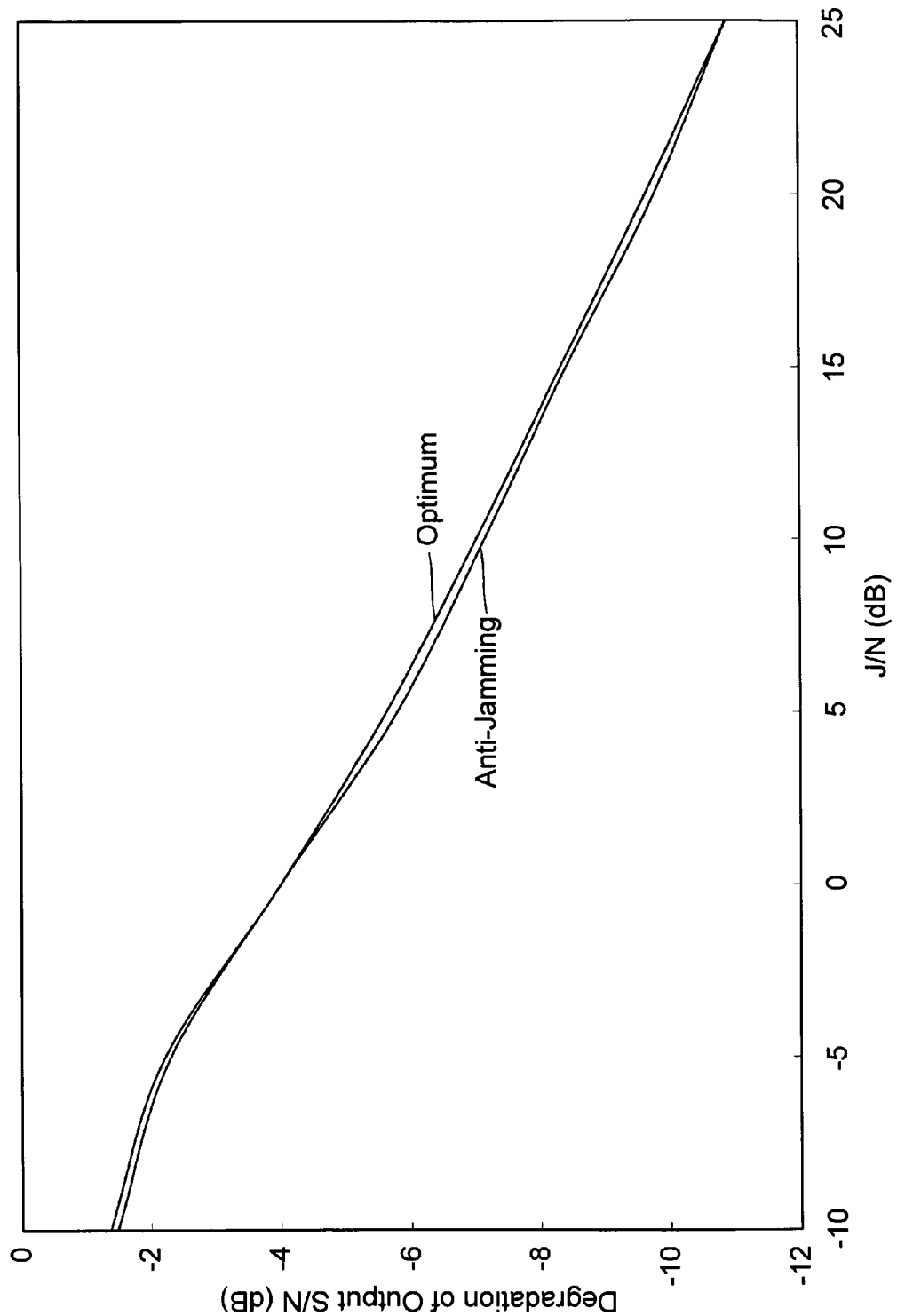
FIG. 7 is a plot comparing calculated degradation in an output SNR ratio as a function of CW interfering signal power for a theoretical optimum and an embodiment of an anti-jamming detection approach.

The performance of this anti-jamming detection approach may be estimated as follows. For an assumed ratio J/N, determine the gain using the AGC 330 (FIG. 3A) that yields the first probability of a non-zero sample $P_1$ equal to ⅔ as illustrated in Equation 2. Since the second non-zero quantization threshold magnitude is twice the first non-zero quantization threshold magnitude in one embodiment, decrease the gain by 6 dB from the value corresponding the first probability of a non-zero sample $P_1$ equal to ⅔ and evaluate the resulting performance. FIG. 7 is a plot of the calculated degradation for the anti-jamming detection approach in the embodiments of the receiver versus the optimum performance. A difference between the results for the anti-jamming detection approach in the embodiments of the receiver and the optimum performance is small over a wide range of the ratio J/N.

Consider an example where the interference is an extremely strong, pulsed signal with a duty factor of 0.1. When the pulse is on, the output of the A/D converters 338 (FIG. 3A) is equal ±1 and the desired signal is obliterated. When the pulse is off, the noise is Gaussian. If the receiver does not use the anti-jamming detection approach, with 2-bit (3-level) quantization the first probability of a non-zero sample $P_1$ or the first activity is approximately 1.0 when the pulse is on and is $P_o$–0.1 when the pulse is off, where $P_o$ is the overall desired activity. In the proposed anti-jamming detection approach, the desired activity $P_o$ equal to 0.667 using the first non-zero quantization threshold magnitude of 0.5V. Thus, when the pulse is off the first activity is 0.567 using the first non-zero quantization threshold magnitude of 0.5V. For Gaussian noise-limited receiver, i.e., when the pulse is off, the second activity is 0.253 using the second non-zero quantization threshold magnitude of V. The performance degradation for the Gaussian noise-limited receiver at this threshold is –1.66 dB. The obliteration of the fraction 0.1 of the signal by the pulse results in an additional 0.92 dB of degradation. Therefore, the total degradation is –2.58 dB. If a duty cycle of the pulse is greater than 0.1, there is significantly greater degradation.

As a consequence, in some embodiments of the receiver one or more of the sub-channels, such as the sub-channel 300 (FIG. 3A), may use a blanking circuit to further mitigate the effects of pulse jamming. In the preceding example, by stopping the processing of signals when the pulse is on and resuming processing when the pulse is off, the performance degradation is just the duty factor loss, i.e., –0.92 dB for the duty factor of 0.1.

Figure 8:
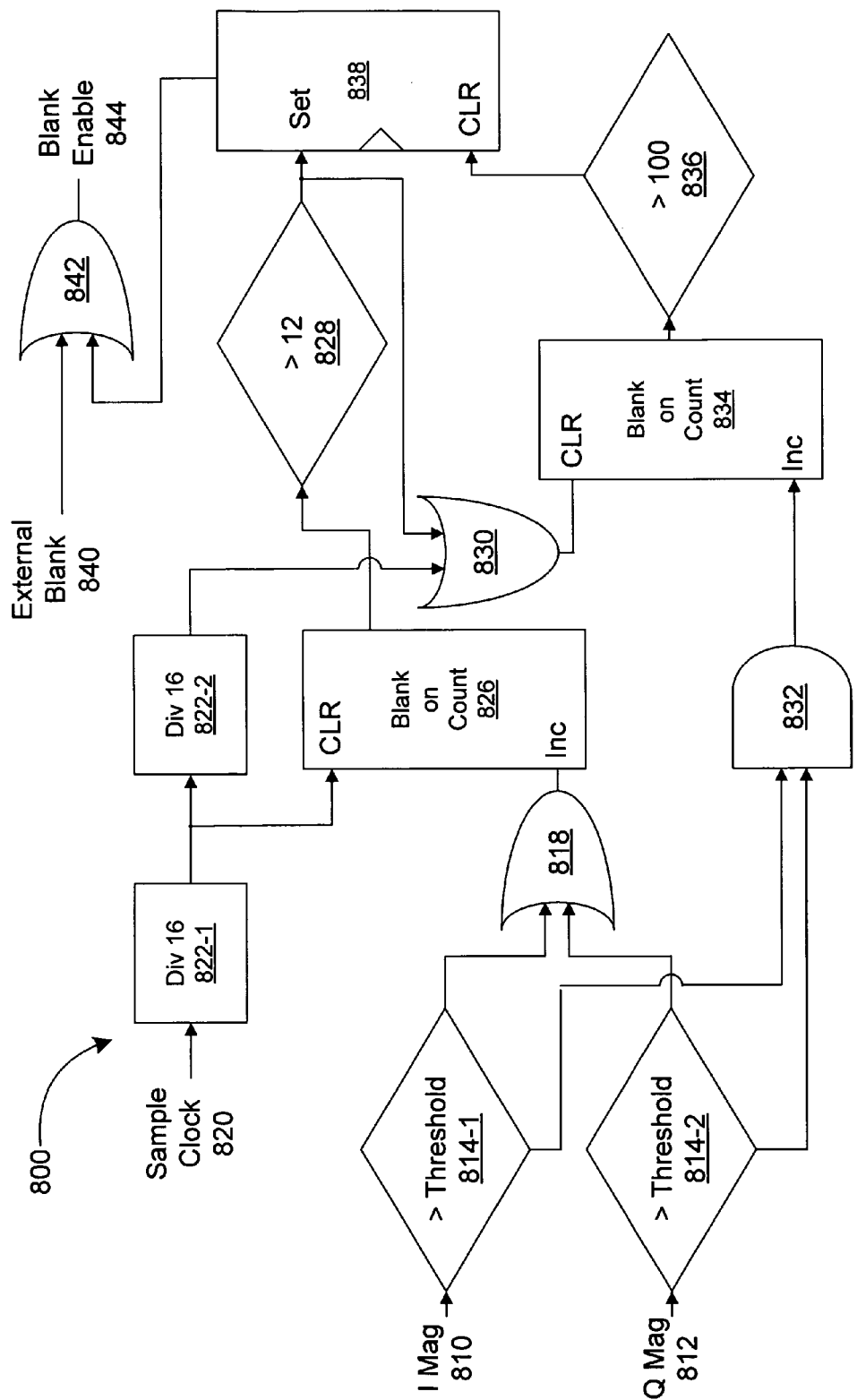
FIG. 8 is a block diagram illustrating a blanking circuit.

FIG. 8 illustrates an embodiment of a blanking circuit 800. The receiver monitors the magnitude of the input samples to detect a sudden increase in a proportion of very large samples caused by a strong interference. If such a sudden increase occurs, the receiver stops processing the signals (enables blanking). Blanking is turned off (disabled) when the receiver detects an absence of large magnitude samples. While blanking is enabled, AGC and zero-adjust feedback are disabled.

A 3-bit magnitude for the I samples 810 and a 3-bit magnitude for the Q samples 812 are compared to a threshold in comparators 814. In some embodiments, the threshold is programmable. If the magnitude of the I samples 810 of the Q samples 812 is larger than the threshold, counter 826 is incremented using OR gate 818. Every 16 sample periods the counters 826 is reset using the sample clock 820 and divide-by-16 circuit 822-1. If the counter 826 reaches a count of 12, as determined by comparator 828, indicating that 12 of 16 measurements have a large magnitude, blanking is enabled 844 using latch 838 and OR gate 842. Once blanking is enabled, it remains enabled until at least 100 of 128 samples have both I and Q with a magnitude less than the threshold. This is implemented using AND gate 832, counter 834, comparator 836 and the latch 838. The counter 834 is reset using divide-by-16 circuits 822 and OR gate 830.

The probability and number of standard deviations for exceeding possible 3-bit sample magnitudes of Gaussian noise is illustrated in Table II. Table II assumes the activity for AGC control is ⅔. The probability of large samples is small, but not prohibitively small. If a very low probability of blanking due to random noise is desired, a group of samples may be monitored and blanking is enabled only when a considerable fraction have large magnitude.

TABLE II 3-bit magnitude, a number of standard deviations from the population mean and a corresponding probability for samples 810 and 812 in the blanking circuit 800.

| Magnitude | Number of Standard Deviations | Probability |
| --- | --- | --- |
| 1 | 0.43 | 0.666 |
| 2 | 0.86 | 0.390 |
| 3 | 1.29 | 0.197 |
| 4 | 1.72 | 0.085 |
| 5 | 2.15 | 0.032 |
| 6 | 2.58 | 0.0099 |
| 7 | 3.01 | 0.0026 |

A large number of simulations were performed to determined the thresholds in the comparators 814 (to enable blanking) and to determine when blanking should be disabled i.e., when pulse jamming is no longer present. Based on these simulations, in an exemplary embodiment of the blanking circuit 800, blanking is enabled if the magnitude for the I samples 810 and/or the magnitude for the Q samples 812 is greater than or equal to 4 for 12 to 16 samples periods (thus, the threshold in the comparators 814 in this example is set to 4). The threshold for the comparators 814 may be eight times the first non-zero quantization threshold magnitude of 0.5V. Hysteresis between enabling and disabling blanking may also be used to reduce toggling of pulse-jamming blanking at a high rate. In the exemplary embodiment, blanking is disabled if both the magnitude of the I samples 810 and the magnitude of the Q samples 812 is less than 4 in 100 of 128 sample periods.

The blanking circuit 800 also supports an externally controlled blanking 840, which enables blanking when it is asserted. This feature may be used when a cooperative, interfering signal is being broadcast, such as a radio transmission or a cooperative pseudolite (for example, a signal corresponding to a fake GPS satellite). Blanking may also be disabled. This is typically used during a first few seconds after the receiver is turned on, to allow AGC 330 (FIG. 3A) and the DC-Offset correction circuits 348 (FIG. 3B) to reach steady state.

Figure 15:
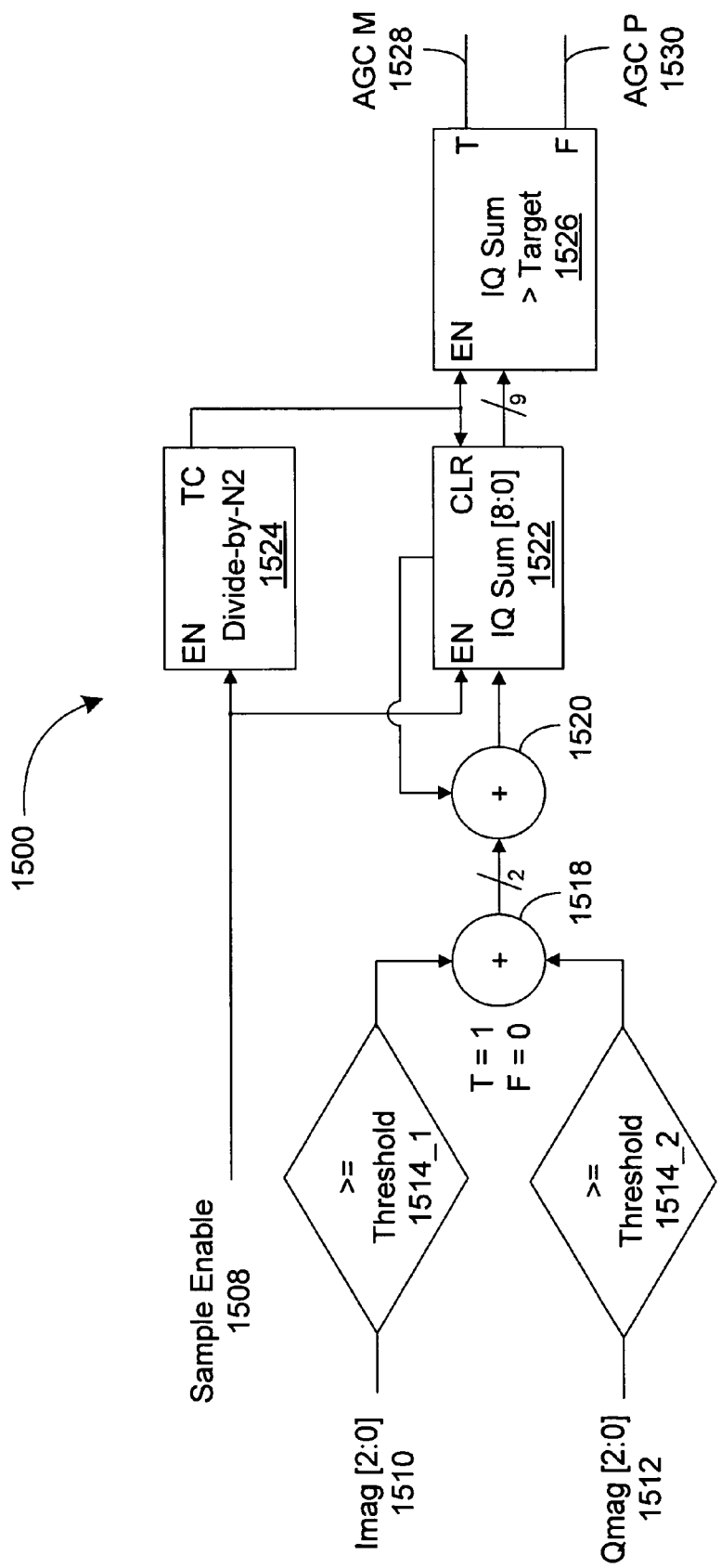
FIG. 15 is a block diagram illustrating an automatic gain control (AGC) circuit in a GNSS receiver.

FIG. 15 illustrates an embodiment of an AGC circuit 1500, such as the AGC 330 (FIG. 3A). The AGC circuit 1500 is simple to implement, provides very good jamming resistance and is transparent to subsequent signal processing stages, such as signal processor 342 (FIG. 3A). A magnitude of I samples 1510 and Q samples 1512 is compared to a threshold in comparators 1514. In some embodiments, the threshold in the comparators 1514 may be programmable. In some embodiments the threshold may be the first non-zero quantization threshold magnitude. If the magnitude of the I samples 1510 and/or the Q samples 1512 is greater than or equal to the threshold, the respective samples are active. If the respective samples are less than the threshold, they are inactive (as was illustrated in the first mapping in Table I). A number of active I samples and/or Q samples may be summed using summers 1518, 1520 and 1522. Summation is set to a time interval of length equal to $N_2$ sample periods using divide-by-$N_2$ feedback 1524. The divide-by-$N_2$ feedback 1524 is gated by sample enable 1508. $N_2$ is chosen so that it is not an integer divisor of a number of samples per ms (to prevent aliasing at a corresponding frequency on the IF and/or one or more clock signals, such as that used to gate at least one of the A/D converters 338 in FIG. 3A). As a consequence, the feedback rate is roughly 200 KHz and the desired activity level can be expressed accurately as a fraction of the form $M/(2 \cdot N_2)$, where M is an integer. In an exemplary embodiment, $N_2$ may equal 176.

At an end of the time interval defined by $N_2$, a count of active I samples and Q samples is compared to a target threshold in comparator 1526. In some embodiments, the target threshold is programmable. In some embodiments the target threshold corresponds to the first probability of a non-zero sample or the first activity. If the summation is greater than the target threshold, there are too many active samples and the gain determined using at least one AGC 330 (FIG. 3A) is reduced by sending a pulse to an inverting input of an AGC opamp on line AGC M 1528. If the summation is less than the target threshold, there are too few active samples. The gain is increased by sending a pulse to a non-inverting input of the AGC opamp on line AGC P 1530. The opamp and supporting circuitry may be chosen so that an effective integration time is between 100 ms and 10 s. As illustrated in the AGC circuit 1500, feedback pulses are at least one sample clock period long. A faster AGC response may be obtained by making a length of the feedback pulses proportional to an absolute value of the I summation and/or the Q summation minus the target threshold, i.e., a proportional feedback control. Note that in embodiments of the receiver using 1-bit quantization in A/D converters 338 (FIG. 3A), AGC feedback may not be needed.

Referring to FIG. 3A, samples from one or more subchannel circuits, such as sub-channel circuit 300, may be processed in signal processor 342. In some embodiments, more than one sub-channel may couple samples to the signal processor 342. In some embodiments, there may be more than one signal processor, and the signal processor may be used cooperatively such that the signal processors function as a single signal processor. Samples from the respective subchannel circuit, such as sub-channel circuit 300, may be routed to more than one of the signal processors.

Signal processing may be implemented in analog circuits, digital circuits or a combination of analog and digital circuits. With the exception of the A/D converters 338, operations may be performed using hardware, such as an application specific integrated circuit (ASIC), software or a combination of hardware and software.

Figure 9:
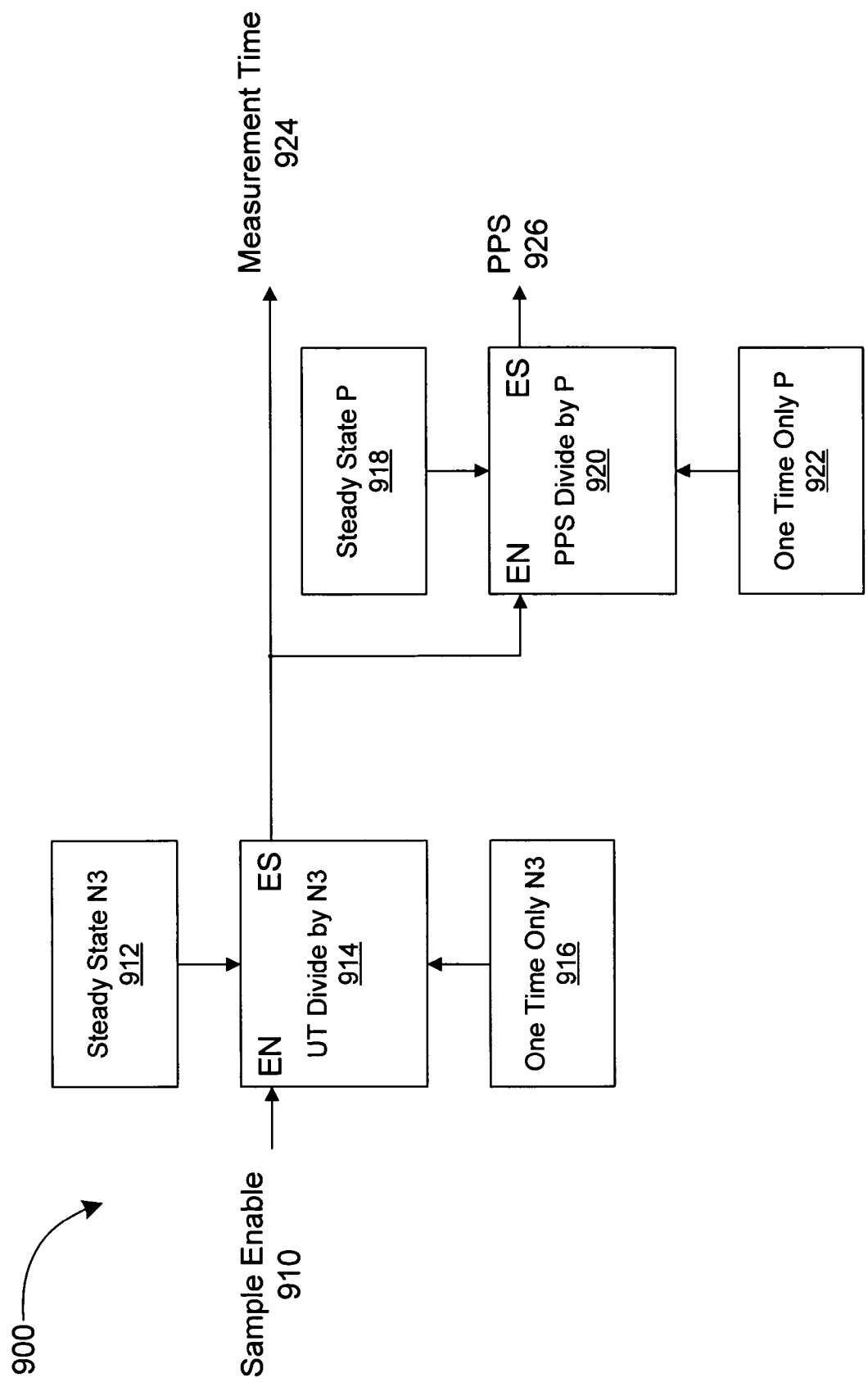
FIG. 9 is a block diagram illustrating a timing circuit.

Timing in the sub-channel circuits, and the A/D converters 338, is useful in the signal processing 342. FIG. 9 illustrates an embodiment of a timing circuit 900. When enabled 910, a measurement time 924 is generated by dividing a sample clock by a programmable integer $N_3$ provided by a steady state N3 register 912. Each time a UT Divide by N3 divider 914 reaches its end state ES, the measurement time 924 occurs and the UT Divide by N3 divider 914 is reinitialized. GNSS data, including a pseudorange register and correlation accumulations, may be buffered for output based on the measurement time 924. Use of the programmable UT Divide by N3 divider 914 allows the sampling rate in the A/D converters 338 (FIG. 3A), the first LO frequency and/or the second LO oscillator frequency to be varied without impacting a design of the signal processor 342 (FIG. 3A). As a consequence, the sampling rate may be adjusted based on the signal bandwidths and/or available components.

Since measurements are based upon a time created by the common reference oscillator in the receiver and/or one or more reference oscillators in one of more sub-channel circuits, such as the reference oscillator 316, the receiver is a user time measurement receiver. Some GNSS receivers time measurements based on events in one or more received satellite signals, such as a start of a 1 ms C/A code epoch. Such receivers are referred to as channel time measurement receivers.

In the timing circuit 900 two variables are available to control a timing of the measurement time 924. The steady state N3 register 912 may be programmed to a number of sample clocks between measurements. UT Divide by N3 divider 914 is reset to a value stored in the steady state N3 register 912 after the UT Divide by N3 divider 914 reaches its end state ES, unless a control software has written a new value, using a one time only N3 register 916, since the last end state. If the new value has been written, UT Divide by N3 divider 914 is set equal to a value in one time only N3 register 916. Typically, the control software will set steady state N3 register 912 to match a frequency of the sample clock. The software then adjusts the timing of measurement time 924 so that it coincides with a universal time coordinate (UTC) or GPS time by periodically shortening or lengthening a length of one measurement period using the one time only N3 register 916.

Control for a pulse per second (PPS) 926 signal is similar to the measurement time 924, except a PPS divide by P divider 920, counts the measurement time 924 signals instead of the sample time. The PPS 926 signal must occur at an integer multiple of the measurement time 924. Again, there are two control variables implemented using a steady state P register 918 and a one time only P register 922. Steady state P register 918 defines a steady-state number of measurement times 924 between PPS 926 outputs and one time only P register 922 is applied once to shift a phase of the PPS 926 with respect to a desired output time. For example, if a GPS navigation solution indicates the sample clock frequency is 40922 clocks per ms and that a last measurement time 924 occurred 10 ms plus 2000 clocks minus a UTC ms epoch, the control software may align the measurement time 924 and the PPS 926 with the UTC by configuring registers as follows. The steady state N3 register 912 may be set to 40922 to match the sample clock frequency and one time only N3 register 916 may be set to 40922 minus 2000 to align the measurement time 924 with the UTC millisecond. A next measurement period will be 38922 clocks long and followed by a steady state measurement period of 40922 clocks. The steady state P register 918 may be set to 1000 to create one pulse per second and one time only P register 922 may be set to 1000 minus 10 to align the PPS 926 with the UTC second. There will be one PPS 926 interval that is 900 measurement periods long followed by a steady state rate of one pulse per 1000 measurement times 924.

Figure 10:
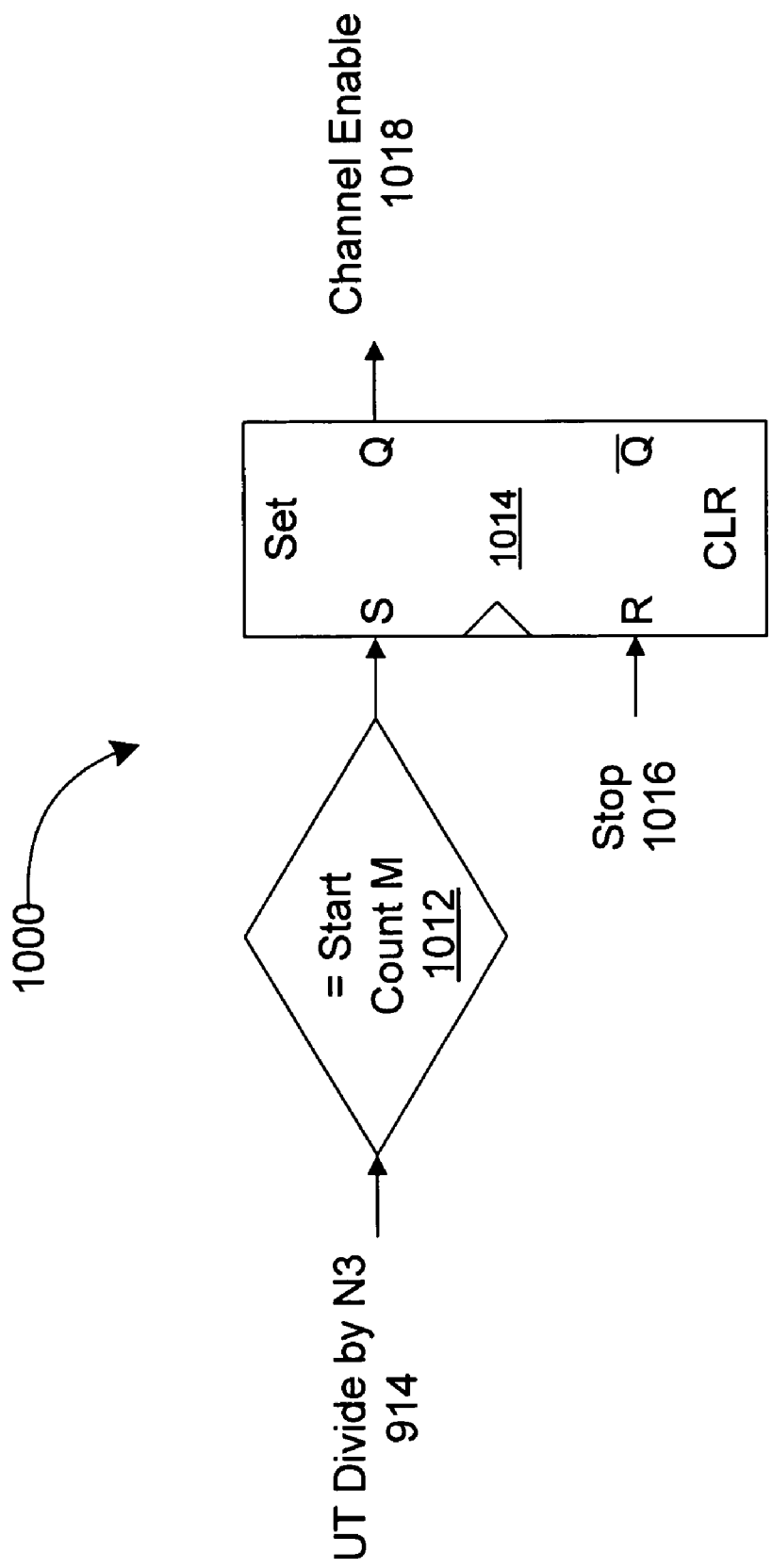
FIG. 10 is a block diagram illustrating a start and stop circuit.

FIG. 10 illustrates an embodiment of a start and stop circuit 1000. A respective channel in the receiver, such as the first channel, may be started by writing a value to a start count M register 1012. This command becomes active at the measurement time 924 (FIG. 9) following a respective write to the start count M register 1012. When the UT divide by N3 divider 914 matches the start time, the respective channel's registers are initialized using channel enable 1018 provided by latch 1014 and the respective channel begins signal processing. By default, coders, such as coder 430 (FIG. 4), start at their initial code state. If a length of a code is longer than 1 ms, the control software may restrict start times or program a code shift register with a proper initial state at the chosen start time.

The respective channel is stopped by writing to the respective channel's stop register. When the stop command 1016 is received, all portions of the respective channel may be turned off and placed into a low-power mode. The respective channel may be reactivated by writing a new command to the start count M register 1012.

Figure 4:
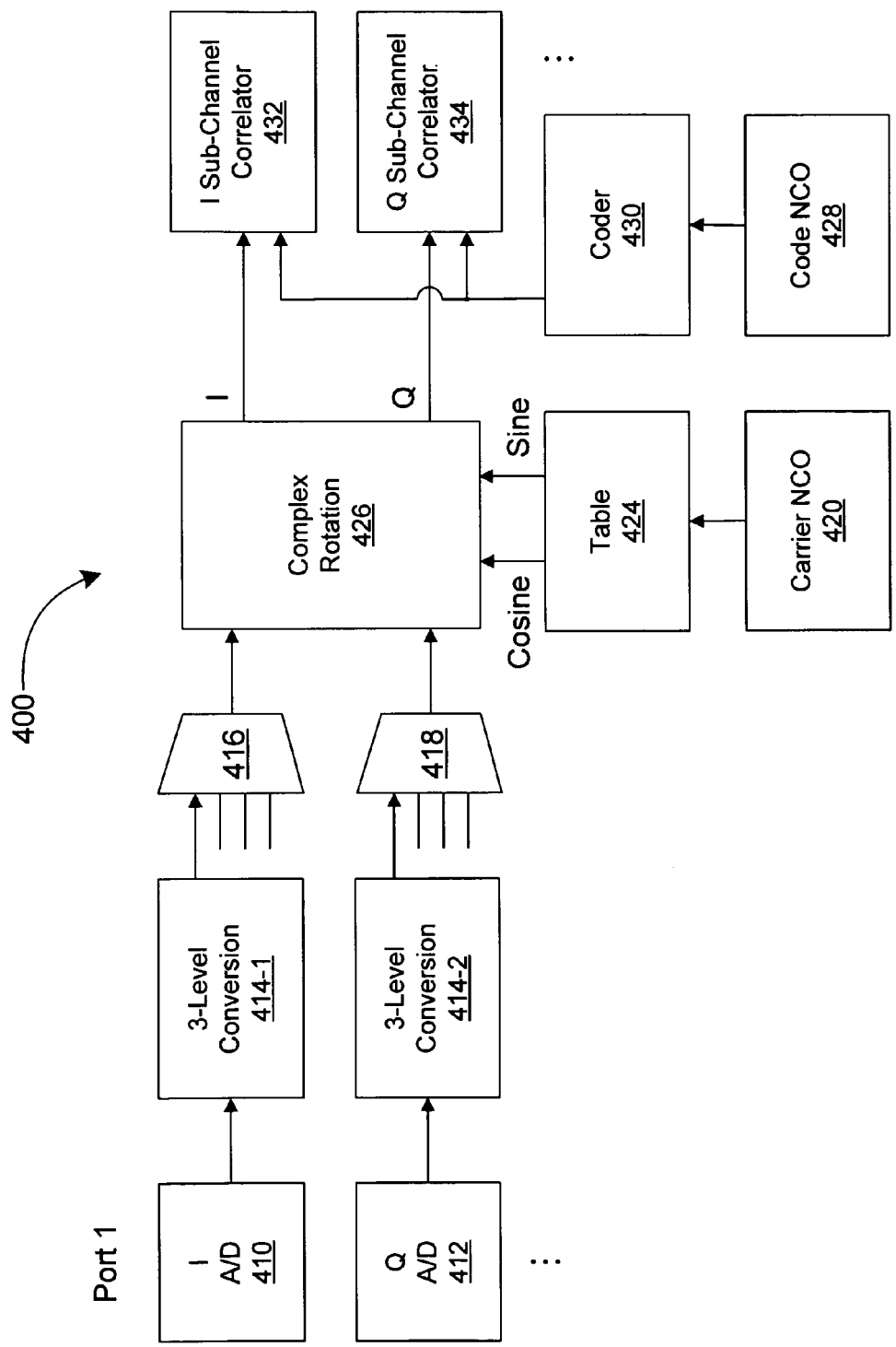
FIG. 4 is a block diagram illustrating signal processing of received signals in a GNSS receiver.

FIG. 4 illustrates an embodiment of a signal processor 400, such as the signal processor 342 (FIG. 3A). A/D converters 410 and 412 provide I and Q samples, respectively. The A/D converters 410 and 412 are a first port to the signal processing circuit 400 for at least the respective sub-channel circuit. Thus, the first port corresponds at least to the respective sub-channel receiving data at a single carrier signal frequency in the signal. There may be one or more additional ports from additional sub-channel circuits coupled either to the signal processing circuit 400 or additional instances of the signal processing circuit 400. In embodiments with a multi-frequency antenna, a separate sub-channel and port may be used for each carrier signal frequency in the signal. In embodiments with multiple antennas, such as in an attitude determination system, a separate port may be needed for each carrier signal frequency in the signals from each antenna.

The I and Q samples are coupled to 3-level converters 414, which perform a mapping from a number of bits in the I and Q samples to the sign and the magnitude as was illustrated in the second mapping in Table I. In some embodiments, the 3-level converters 414 may be implemented using a circuit instead of a look-up table, such as the look-up table 344 (FIG. 3A). The samples are coupled to multiplexers 416 and 418, which couple the remainder of the signal processing circuit 400 to at least one of the ports.

Referring to FIG. 3A, the reference signals from the quadrature signal generator 324 may not be exactly 90° out of phase. If the signal is down converted to baseband, a phase error or bias, and a corresponding signal processing loss, results. As a consequence, conventional receivers typically do not use quadrature detection and sampling as illustrated in FIG. 3A. In addition, sampling and quantization is usually typically not at baseband. Instead, sampling and quantization may typically be performed at a residual IF, such as a quarter of the sampling rate of an A/D converter, such as A/D converters 338. By increasing the sampling rate of the A/D converter and averaging samples, the residual bias may be removed. In essence, the A/D converter in these conventional receivers down converts the signal to baseband. However, the resulting I and Q samples are determined over a time interval. This may make correction of the multi-path signal 116 (FIG. 1) more difficult. There may also be a power penalty associated with the increased sampling rate of the A/D converter. In those conventional receivers that implement a down conversion directly from radio frequencies to near baseband, quadrature detection is usually not used.

In the receiver in device 110 (FIG. 1), the signal is down converted to substantially near baseband and, as previously described in the discussion of the sub-channel circuit 300, may be sampled and quantized in quadrature. This detection approach allows I and Q samples to be determined substantially simultaneously. This, in turn, may allow improved correction of the multi-path signal 116 (FIG. 1) and lower power consumption. There is, however, still the issue of possible residual bias associated with phase errors in the reference signals from the quadrature signal generator 324. Down converting to substantially near baseband offers a solution. As noted previously, the resulting signal effectively has an intentional Doppler frequency shift. A complex phase rotation may be performed during signal processing 342 to correct for this intentional Doppler frequency shift. In the process, the corresponding bias is substantially uniformly distributed over 0-360° and averages to zero.

Referring back to FIG. 4, the complex rotation to correct for the residual bias and the intentional Doppler frequency shift associated with down conversion to substantially near baseband is performed in complex rotation circuit 426 (for example, by forcing the Q samples to equal 0). As discussed further below, the complex rotation may be based on a value in look-up table 424. The value is determined based on a carrier signal generator or NCO 420, which is part of a carrier or phase tracking loop that determines the intentional Doppler frequency shift to be corrected. At least the one spread-spectrum code in the samples of the signal is de-modulated in correlators 432 and 434 based on the coder 430 and a code signal generator or NCO 428, which is part of a code tracking loop. The I and Q accumulations from the subchannel correlators 432 and 434 are output at the measurement time 924 (FIG. 9) to signal processing software where the accumulations may be used to compute feedback for the phase and code tracking loops.

Rotation and correlation operations in effect mix the satellite signal embedded in the I and Q samples with a replica of the signal generated by the respective channel. If the phase, frequency and timing of the replica signal substantially duplicate those received from the satellite, a power accumulated by the sub-channel correlators 432 and 434 is maximized. If there are timing errors in the replica signal, the power accumulated by the correlators 432 and 434 is reduced if the timing of the code is in error by less than one spread-spectrum code bit, or is zero if the error is greater than or equal to a spread-spectrum code bit.

The rotation and correlation operations occur at the sample rate, so there is very little SNR loss due to signal processing. The order of the rotation and correlation operations is arbitrary. Therefore, in some embodiments, correlation may be performed before rotation, rotation may be performed before correlation or the operations of rotation and correlation may be combined into a single operation. In an exemplary embodiment, rotation is performed before correlation. This allows one rotation per I and Q sample pair to be performed. There are, however, many possible correlations, including one set per sub-channel.

Figure 11:
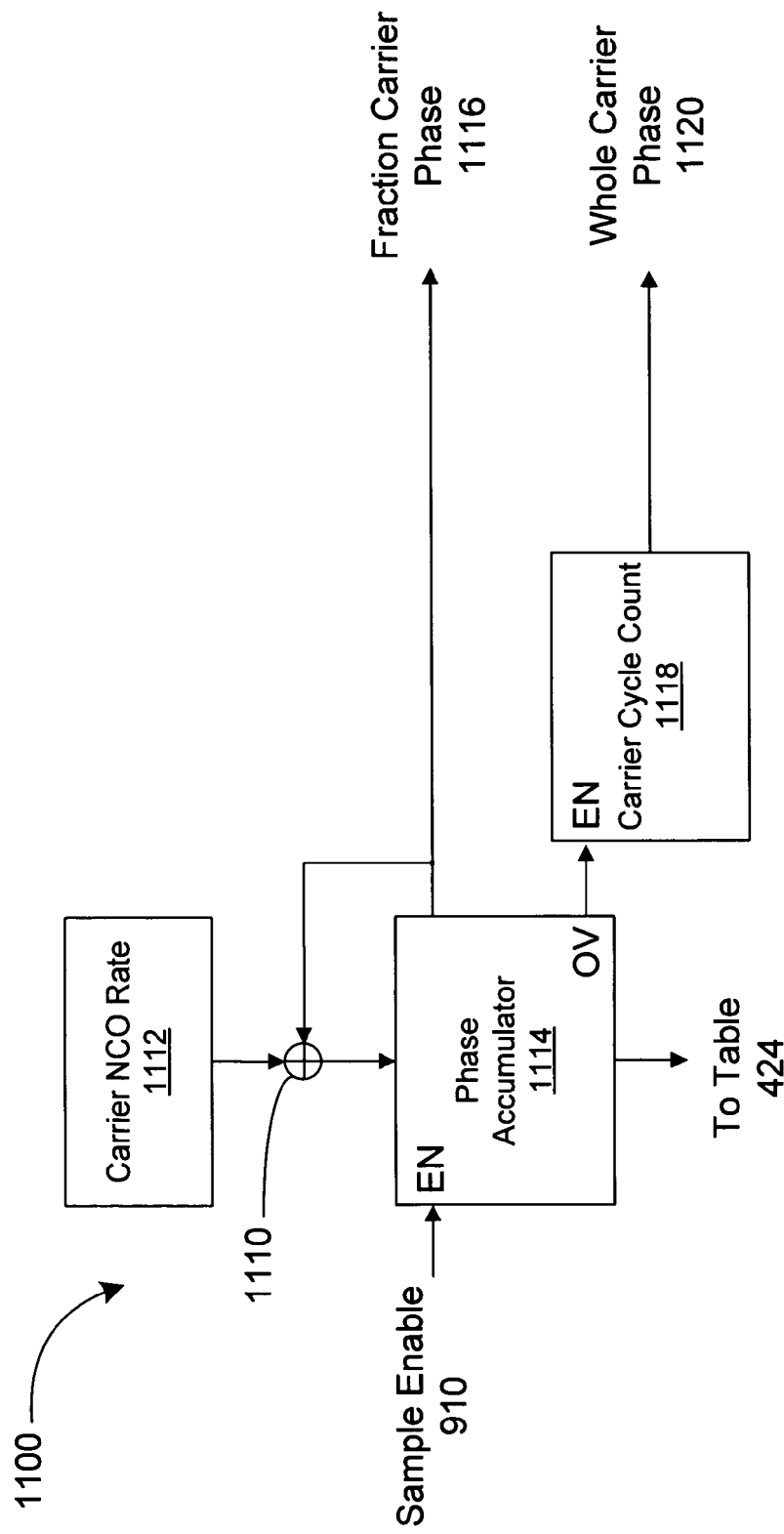
FIG. 11 is a block diagram illustrating a carrier numerically controlled oscillator (NCO).

As shown in FIG. 4, the I and Q samples from one or more sub-channel circuits, such as the sub-channel circuit 300 (FIG. 3A), are mixed with a carrier signal component of the reference signal for the respective channel by the complex rotation 426 of the I and Q samples. Rotated samples $I_R$ and $Q_R$ are generated using $$I_R = I \cdot \cos(NCO) - Q \cdot \sin(NCO)$$

$$Q_R = I \cdot \sin(NCO) + Q \cdot \cos(NCO),$$

where NCO represents a value from the table 424 based on the carrier NCO 420. FIG. 11 illustrates an embodiment of a carrier NCO 1100, such as the carrier NCO 420 (FIG. 4). When enabled 910, the carrier NCO 1100 maintains the phase of the reference signal for the respective channel, such as the first channel, by integrating a carrier NCO rate (scaled signal Doppler) value in register 1112 using summation circuit 1110 and phase accumulator 1114. The fraction carrier phase and receiver's reference spread-spectrum code are mixed with the RF section input data to produce in-phase I and quadrature Q correlation measurements. The I and Q measurements are used by the feedback loops to create the NCO rate value and a fractional rate or fractional carrier phase 1116. The feedback rate or fractional carrier phase 1116 is used to close a frequency or phase tracking loops such as an automatic frequency control loop, a Costas loop or a phase lock loop. The control software may update the carrier NCO rate at any rate equal to or slower than once per ms. A loop update rate is a design parameter of the tracking loop. For example, typical feedback rates are equal to about $\frac{1}{10}$ of the loop bandwidth. Faster feedback rates increase processing load but may have little affect on loop performance. Feedback rates slower than $\frac{1}{10}$ the loop bandwidth may loose lock or increase loop noise under dynamic conditions.

The phase of the reference signal or the carrier phase is integrated using the phase accumulator 1114. A carrier phase angle is assumed to be zero when the respective channel is started at a respective reference oscillator clock edge. In actuality, the phase is not zero at the start time, but the corresponding tracking error will be reflected in the I and Q samples. Carrier phase tracking will correct the reference phase angle. After the respective channel starts and until it is turned off, the 32-bit phase carrier NCO rate value is added to the 32-bit phase accumulator 1114 every clock cycle. A least significant bit of the carrier phase is $2^{-32}$ cycles of the carrier cycle. A least significant bit of the carrier NCO rate register 1112 is $2^{-32}$ carrier cycles per clock. If a clock rate in the signal processor 400 (FIG. 4) is 40.9216 MHz, the least significant bit of the carrier NCO rate register 1112 is equal to 0.0095278 Hz (104.96 bits per Hz), and a range of the register 1112 is 0 to 40.9212589 MHz. Due to the previously discussed intentional frequency offset of the reference oscillator, the Doppler is always positive.

A configuration and weighting of bits in the complex phase rotations depends upon the sine/cosine table 424 (FIG. 4) that is used for the phase rotations. Table III illustrates a 5-bit, 11·cosine/11·sine implementation. Table III is indexed using a 4 most-significant bits of the phase accumulator 1114. The most significant of the 4 bits has a weight of 0.5 cycles and the least significant bit has a weight to $\frac{1}{16}$ cycle or 22.5 degrees. An average amplitude of integer values in Table III is 10.96. The power in the non-fundamental component of a Fourier transform of Table III is less than 0.1 dB, so Table III introduces negligible processing loss.

TABLE III

An embodiment of a sine/cosine table 424 (FIG. 4).

| 4 bit Phase Value | Angle (deg) | Cosine | Sine | 11 · cosine | 11 · sine | Table Cosine Value | Table Sine Value |
| --- | --- | --- | --- | --- | --- | --- | --- |
| 0000 | 0 | 1.0000 | 0.0000 | 11.0000 | 0.0000 | 11 | 0 |
| 0001 | 22.5 | 0.9239 | 0.3827 | 10.1627 | 4.2095 | 10 | 4 |
| 0010 | 45.0 | 0.7071 | 0.7071 | 7.7781 | 7.7781 | 8 | 8 |
| 0011 | 67.5 | 0.3827 | 0.9239 | 4.2095 | 10.1627 | 4 | 10 |
| 0100 | 90 | 0.0000 | 1.0000 | 0.0000 | 11.0000 | 0 | 11 |

TABLE III-continued

An embodiment of a sine/cosine table 424 (FIG. 4).

| 4 bit Phase Value | Angle (deg) | Cosine | Sine | 11 · cosine | 11 · sine | Table Cosine Value | Table Sine Value |
|---|---|---|---|---|---|---|---|
| 0101 | 112.5 | −0.3827 | 0.9239 | −4.2095 | 10.1627 | −4 | 10 |
| 0110 | 135.0 | −0.7071 | 0.7071 | −7.7781 | 7.7781 | −8 | 8 |
| 0111 | 157.5 | −0.9239 | 0.3827 | −10.1627 | 4.2095 | −10 | 4 |
| 1000 | 180 | −1.0000 | 0.0000 | −11.0000 | 0.0000 | −11 | 0 |
| 1001 | 202.5 | −0.9239 | −0.3827 | −10.1627 | −4.2095 | −10 | −4 |
| 1010 | 225.0 | −0.7071 | −0.7071 | −7.7781 | −7.7781 | −8 | −8 |
| 1011 | 247.5 | −0.3827 | −0.9239 | −4.2095 | −10.1627 | −4 | −10 |
| 1100 | 270.0 | 0.0000 | −1.0000 | 0.0000 | −11.0000 | 0 | −11 |
| 1101 | 292.5 | 0.3827 | −0.9239 | 4.2095 | −10.1627 | 4 | −10 |
| 1110 | 315.0 | 0.7071 | −0.7071 | 7.7781 | −7.7781 | 8 | −8 |
| 1111 | 337.5 | 0.9239 | −0.3827 | 10.1627 | −4.2095 | 10 | −4 |

In the carrier NCO circuit 1100, overflow of the phase accumulator 1114 indicates an accumulation of one cycle of integrated Doppler. A carrier cycle count register 1118 counts the overflows and outputs whole carrier phase 1120. A finite difference of successive measurements may be use as a delta carrier phase measurement, where an integration is initially set equal to zero so an integrated value during an interval corresponds to a phase change.

Figure 13:
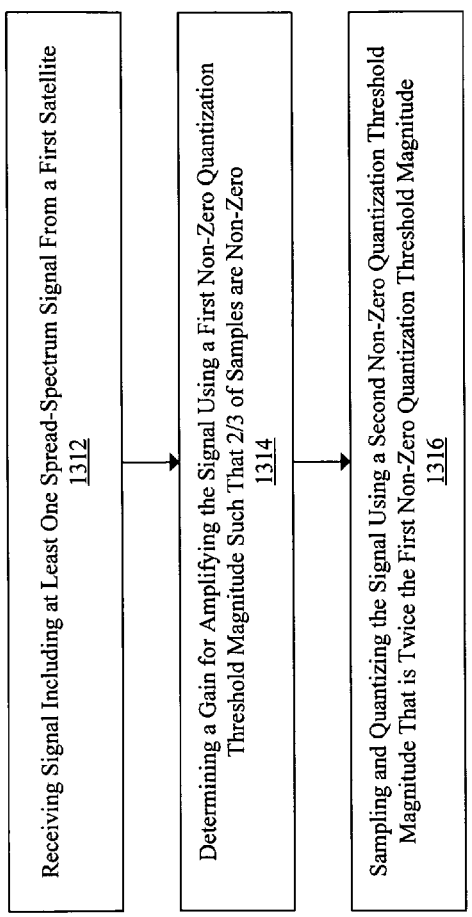
FIG. 13 is a flow diagram illustrating a method of operating a GNSS receiver.

FIG. 13 illustrates an embodiment of operations in the satellite navigation device. A signal including at least one spread-spectrum signal from a first satellite is received (1312). A gain for amplifying the signal is determined using a first non-zero quantization threshold magnitude such that ⅔ of samples are non-zero (1314). The signal is sampled and quantized using a second non-zero quantization magnitude that is twice the first non-zero quantization threshold magnitude. In some embodiments, there may be fewer or additional operations, an order of the operations may be rearranged and/or two or more operations may be combined.

Figure 12:
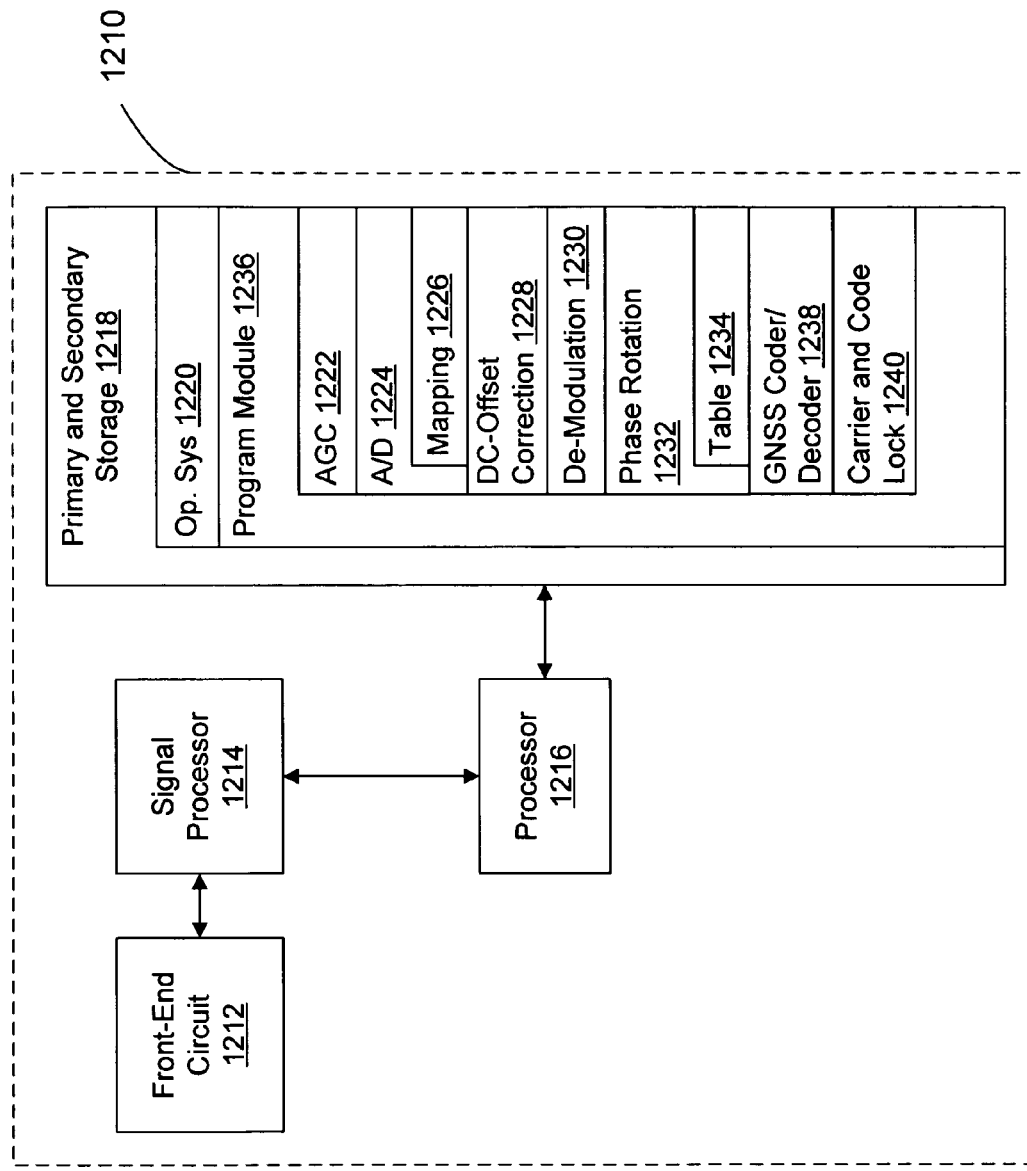
FIG. 12 is a block diagram illustrating components in a GNSS receiver.

FIG. 12 illustrates an embodiment of a device 1210, such as the device 110 (FIG. 1), in a global navigation satellite system (GNSS). The device 1210 includes a front-end circuit 1212, a signal processor 1214, such as signal processor 342 (FIG. 3A), at least one processor 1216 and a memory 1218. The memory 1218, which may include high-speed random access memory and may also include non-volatile memory, such as one or more magnetic disk storage devices, EEPROM and/or Flash EEPROM, includes an operating system 1220 and at least one program module 1236, executed by processor 1216. At least the one program module 1236 includes instructions and/or files corresponding to circuits for AGC 1222, A/D converter 1224, DC-Offset correction 1228, de-modulation 1230, phase rotation 1232, GNSS coder/decoder 1238 and carrier and code lock 1240. The A/D converter 1224 includes one or more mappings 1226. The phase rotation 1232 includes sine/cosine table 1234. The program module 1236 may include optional multi-path correction (such as a double-delta correction, a strobed correlator and a pulse-aperture correlator) and/or a multi-path calculation. The program module 1236 may also include instructions for adjusting the IF, filters, mixers and/or LO frequencies in one of more channels, such as the first channel, and/or one or more sub-channel circuits, such as the sub-channel circuit 300 (FIG. 3A). In some embodiments there may be more than one processor 1216. In other embodiments, the device 1210 may include an ASIC and some or all of the functionality of at least the one program module 1236, executed by the processor 1216, may be implemented in the ASIC.

The foregoing description, for purposes of explanation, used specific nomenclature to provide a thorough understanding of the invention. However, it will be apparent to one skilled in the art that the specific details are not required in order to practice the invention. The embodiments were chosen and described in order to best explain the principles of the invention and its practical applications, to thereby enable others skilled in the art to best utilize the invention and various embodiments with various modifications as are suited to the particular use contemplated. Thus, the foregoing disclosure is not intended to be exhaustive or to limit the invention to the precise forms disclosed. Many modifications and variations are possible in view of the above teachings.

It is intended that the scope of the invention be defined by the following claims and their equivalents.

What is claimed:

1. A satellite navigation device, comprising:
a receiver that receives a signal that includes at least a first spread-spectrum signal from a first satellite, the receiver having a first channel, the first channel including:
an analog-to-digital converter to sample the signal and determine quantized signal values having two, three, four, five, or more bits, to perform a first mapping of the quantized signal values to first sample values using a first non-zero quantization threshold magnitude, and to perform a second mapping of the first sample values to second sample values using a three-level quantization with a second non-zero quantization threshold magnitude;
an automatic gain control to adjust a gain of the signal; and
control logic to determine the gain such that the first mapping produces a first pre-determined probability of a respective non-zero first sample value of the first sample values.

2. The satellite navigation device of claim 1, wherein adjusting the gain and performing the first and second mappings reduce an effect of an interference signal on the receiver at an arbitrary ratio of interference signal power to receiver noise power.

3. The satellite navigation device of claim 1, wherein the quantized signal values have a number of bits selected from the group consisting of 2, 3, 4 and 5.

4. The satellite navigation device of claim 1, further comprising a dc-offset correction circuit to substantially reduce a dc-offset in the signal.

5. The satellite navigation device of claim 1, further comprising a look-up table to provide the first mapping and the second mapping to the analog-to-digital converter, and wherein non-zero first sample values in the first mapping are defined based on the first non-zero quantization threshold magnitude and non-zero second sample values in the second mapping are defined based on the second non-zero quantization threshold magnitude.

6. The satellite navigation device of claim 1, further comprising a down-conversion circuit, wherein the down-conversion circuit converts the signal from a first carrier frequency signal to a near baseband signal, the near baseband signal having a second carrier frequency signal substantially less than one-quarter of a sampling rate.

7. The satellite navigation device of claim 6, wherein the second carrier frequency signal is less than approximately 100 kHz.

8. The satellite navigation device of claim 6, further comprising a phase rotation circuit to perform a complex phase rotation on quantized quadrature samples of the near baseband signal such that a residual bias is substantially distributed uniformly over phase angles of 0 to 360° and thereby averages to substantially zero over an integration period corresponding to the first spread-spectrum signal.

9. The satellite navigation device of claim 8, wherein the phase rotation circuit is configured to use a look-up table to perform the complex phase rotation.

10. The satellite navigation device of claim 1, further comprising a blanking circuit, wherein the blanking circuit, when enabled, sums a number of events where a respective sample of the signal exceeds a threshold during a time interval and disables the receiver if the number of events exceeds a value.

11. The satellite navigation device of claim 10, wherein the threshold is eight times the first non-zero quantization threshold magnitude.

12. A satellite navigation device, comprising:
a receiver mechanism that receives a signal that includes at least a first spread-spectrum signal from a first satellite, the receiver mechanism having a first channel, the first channel including:
    means for sampling the signal and determining quantized signal values having two, three, four, five, or more bits, performing a first mapping of the quantized signal values to first sample values using a first non-zero quantization threshold magnitude, and performing a second mapping of the first sample values to second sample values using a three-level quantization with a second non-zero quantization threshold magnitude; and
    means for adjusting a gain of the signal, the gain being determined such that the first mapping produces a first pre-determined probability of a respective non-zero first sample value of the first sample values.

13. A method of operating a satellite navigation device, comprising:
    receiving a signal using a receiver, the signal including at least a first spread-spectrum signal from a first satellite;
    adjusting a gain of the signal;
    sampling the signal to determine quantized signal values having two, three, four, five, or more bits;
    performing a first mapping of the quantized signals values to first sample values using the first non-zero quantization threshold magnitude; and
    performing a second mapping of the first sample values to second sample values using a three-level quantization with a second non-zero quantization threshold magnitude;
    wherein the gain is determined such that the first mapping produces a first pre-determined probability of a respective non-zero first sample value of the first sample values.

14. The method of claim 13, wherein adjusting the gain and performing the first and second mappings reduce an effect of an interference signal on the receiver at an arbitrary ratio of interference signal power to receiver noise power.

15. The method of claim 13, wherein the quantized signal values have a number of bits selected from the group consisting of 2, 3, 4 and 5.

16. The method of claim 13, further comprising substantially reducing a dc-offset in the signal.

17. The method of claim 13, wherein non-zero samples in the first mapping are determined based on the first non-zero quantization threshold magnitude and non-zero samples in the second mapping are determined based on the second non-zero quantization threshold magnitude.

18. The method of claim 17, wherein the first mapping and the second mapping use a look-up table.

19. The method of claim 13, further comprising converting the signal from a first carrier frequency signal to a near baseband signal, wherein the near baseband signal has a second carrier frequency signal substantially less than one-quarter of a sampling rate.

20. The method of claim 19, wherein the second carrier frequency signal is less than approximately 100 kHz.

21. The method of claim 19, further comprising performing a complex phase rotation on quantized quadrature samples of the near baseband signal such that a residual bias is substantially distributed uniformly over phase angles of 0 to 360° and thereby averages to substantially zero over an integration period corresponding to the first spread-spectrum signal.

22. The method of claim 21, wherein performing the complex phase rotation includes determining the complex phase rotation using a look-up table.

23. The method of claim 13, further comprising summing a number of events where a respective sample of the signal exceeds a threshold during a time interval and temporarily disabling the receiving if the number of events exceeds a value.

24. The method of claim 23, wherein the threshold is eight times the first non-zero quantization threshold magnitude.

* * * * *